(12) United States Patent
Lee et al.

(10) Patent No.: US 9,941,291 B2
(45) Date of Patent: Apr. 10, 2018

(54) THREE-DIMENSIONAL NON-VOLATILE MEMORY DEVICE

(71) Applicant: SK hynix Inc., Icheon-si, Gyeonggi-do (KR)

(72) Inventors: Ki Hong Lee, Suwon-si (KR); Seung Ho Pyi, Seongnam-si (KR); Il Do Kim, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 54 days.

(21) Appl. No.: 14/879,790

(22) Filed: Oct. 9, 2015

(65) Prior Publication Data

US 2016/0035732 A1 Feb. 4, 2016

Related U.S. Application Data

(63) Continuation of application No. 13/846,745, filed on Mar. 18, 2013, now Pat. No. 9,190,514.

(30) Foreign Application Priority Data

Nov. 16, 2012 (KR) .................. 10-2012-0130163

(51) Int. Cl.
*H01L 27/115* (2017.01)
*H01L 29/78* (2006.01)
*H01L 27/11565* (2017.01)
*H01L 27/1157* (2017.01)
*H01L 27/11582* (2017.01)
*H01L 29/66* (2006.01)

(52) U.S. Cl.
CPC ........ *H01L 27/115* (2013.01); *H01L 27/1157* (2013.01); *H01L 27/11565* (2013.01); *H01L 27/11582* (2013.01); *H01L 29/66666* (2013.01); *H01L 29/7827* (2013.01)

(58) Field of Classification Search
CPC ..................... H01L 29/66666; H01L 29/7827
See application file for complete search history.

(56) References Cited

U.S. PATENT DOCUMENTS

| 5,477,071 A | 12/1995 | Hamamoto et al. |
| 2009/0321813 A1 | 12/2009 | Kidoh et al. |
| 2010/0133598 A1 | 6/2010 | Chae et al. |
| 2010/0207195 A1* | 8/2010 | Fukuzumi .......... G11C 16/0483 257/326 |

(Continued)

FOREIGN PATENT DOCUMENTS

| CN | 102237368 A | 11/2011 |
| CN | 102263109 A | 11/2011 |

(Continued)

*Primary Examiner* — Lex Malsawma
*Assistant Examiner* — Gardner W Swan
(74) *Attorney, Agent, or Firm* — William Park & Associates Ltd.

(57) ABSTRACT

A semiconductor device includes at least one first conductive layer stacked on a substrate where a cell region and a contact region are defined; at least one first slit passing through the first conductive layer, second conductive layers stacked on the first conductive layer; a second slit passing through the first and second conductive layers and connected with one side of the first slit, and a third slit passing through the first and second conductive layers and connected with the other side of the first slit.

8 Claims, 24 Drawing Sheets

(56) References Cited

U.S. PATENT DOCUMENTS

| | | | |
|---|---|---|---|
| 2010/0213538 A1 | 8/2010 | Fukuzumi et al. | |
| 2011/0065270 A1* | 3/2011 | Shim | H01L 27/11556 438/589 |
| 2011/0312174 A1* | 12/2011 | Lee | H01L 27/11582 438/595 |
| 2012/0003800 A1* | 1/2012 | Lee | H01L 27/11551 438/261 |
| 2012/0241846 A1 | 9/2012 | Kawasaki et al. | |
| 2012/0276719 A1* | 11/2012 | Han | H01L 29/7926 438/478 |

FOREIGN PATENT DOCUMENTS

| | | |
|---|---|---|
| CN | 102468283 A | 5/2012 |
| CN | 102646678 A | 8/2012 |
| CN | 102449699 B | 9/2015 |
| TW | 469631 B | 12/2001 |
| TW | 200419780 A | 1/2005 |
| TW | 200304217 A | 4/2005 |
| TW | 200703624 A | 4/2007 |
| TW | 200807635 A | 2/2008 |
| TW | 200605364 A | 9/2011 |

\* cited by examiner

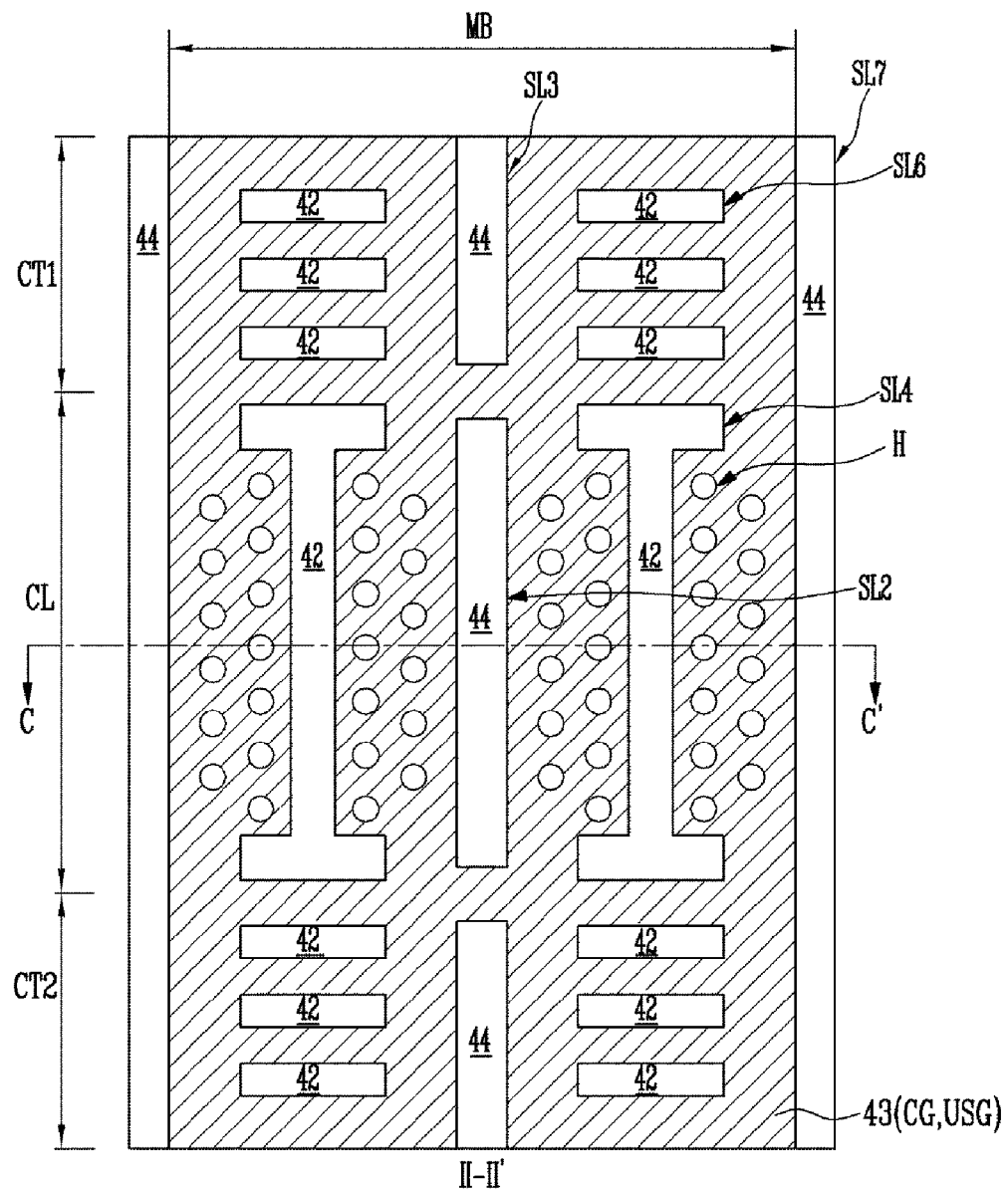

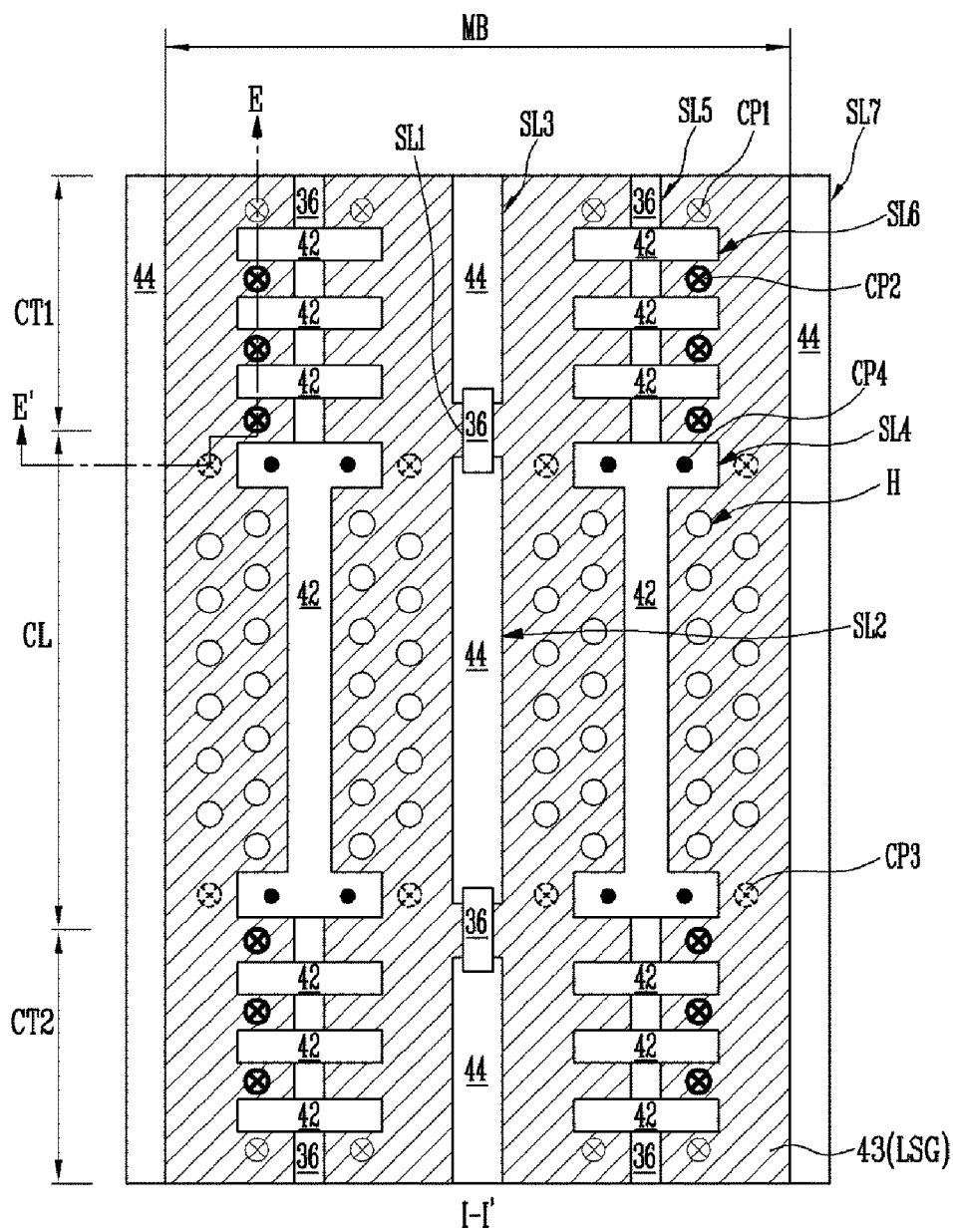

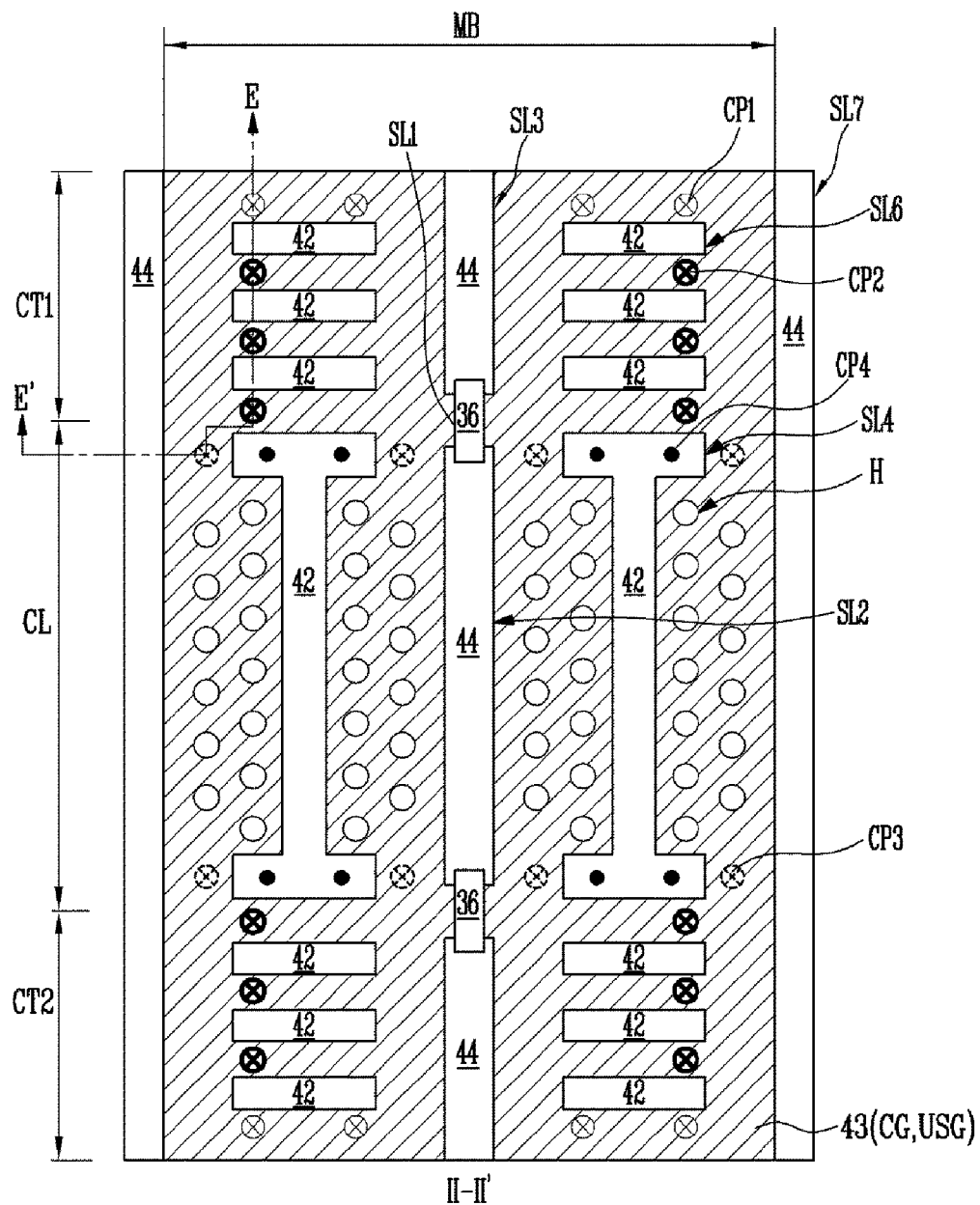

THREE-DIMENSIONAL NON-VOLATILE MEMORY DEVICE

CROSS-REFERENCE TO RELATED APPLICATION

The present application is a Continuation of U.S. application Ser. No. 13/846,745, filed on Mar. 18, 2013, and the present application claims priority to Korean patent application number 10-2012-0130163 filed on Nov. 16, 2012, in the Korean Intellectual Property Office, the entire disclosure of which is incorporated by reference herein.

BACKGROUND

1. Technical Field

Various embodiments relate generally to a semiconductor device and a method of manufacturing the same and, more particularly, to a three-dimensional semiconductor device and a method of manufacturing the same.

2. Related Art

A non-volatile memory retains data stored therein even when not powered. Two-dimensional memory devices in which memory cells are fabricated in a single layer over a silicon substrate have reached physical limits in increasing their degree of integration. Accordingly, three-dimensional (3D) non-volatile memory devices in which memory cells are stacked in a vertical direction over a silicon substrate have been proposed.

A 3D non-volatile memory device includes interlayer insulating layers and conductive layers stacked alternately with each other and channel layers passing there though. A lower selection transistor, memory cells and an upper selection transistor are stacked along the channel layers. Therefore, the stacked conductive layers are to be patterned in order to selectively drive desired memory cells.

BRIEF SUMMARY

An embodiment relates to a semiconductor device capable of easily patterning stacked conductive layers and a method of manufacturing the same.

A semiconductor device according to an embodiment of the present invention includes at least one first conductive layer stacked on a substrate where a cell region and a contact region are defined; at least one first slit passing through the first conductive layer, second conductive layers stacked on the first conductive layer; a second slit passing through the first and second conductive layers and connected with one side of the first slit, and a third slit passing through the first and second conductive layers and connected with an other side of the first slit.

BRIEF DESCRIPTION OF THE DRAWINGS

FIGS. 3A to 8C are layout views or cross-sectional views illustrating a method of manufacturing a semiconductor device according to first embodiments of the present invention;

DETAILED DESCRIPTION

Figure 1A:
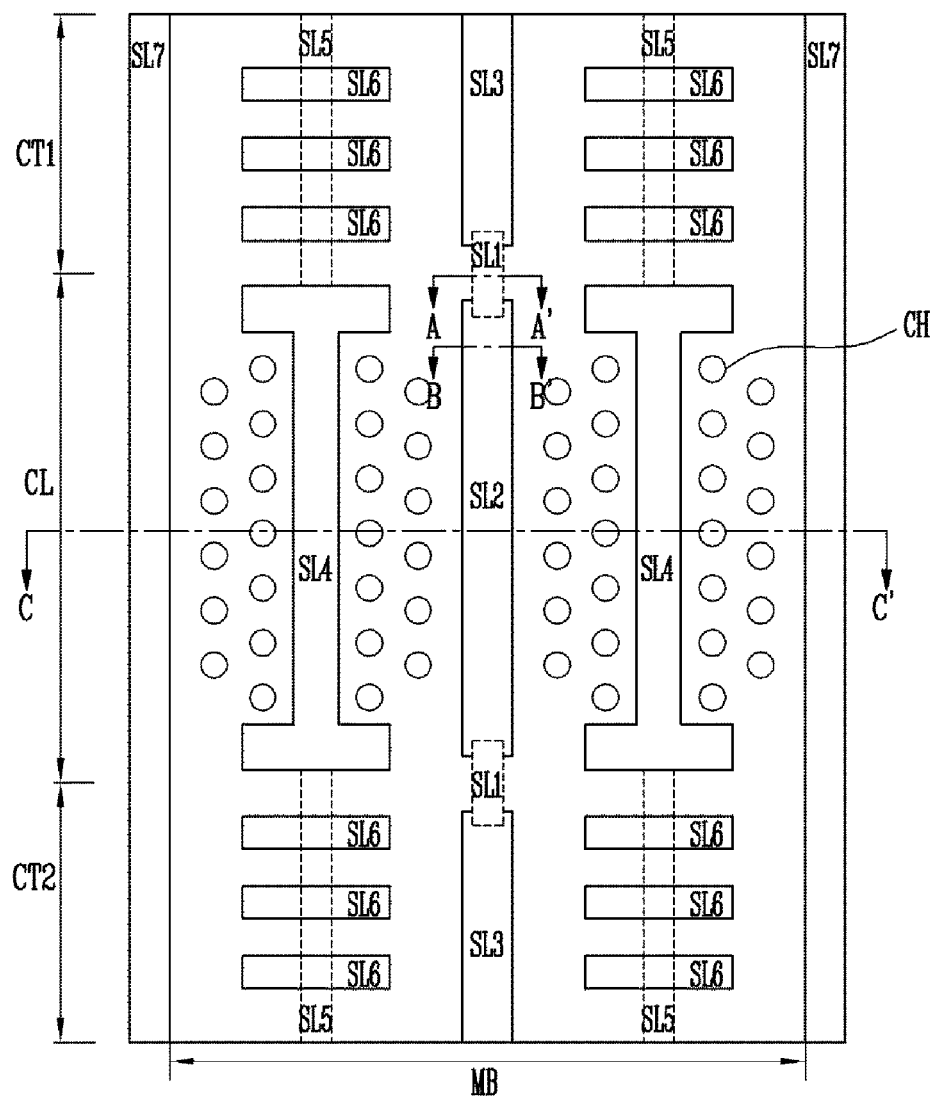
FIG. 1A is a layout view illustrating the structure of a semiconductor device according to an embodiment of the present invention.

Hereinafter, various embodiments of the present invention will be described with reference to the accompanying drawings. In the drawings, a thicknesses and a distance of components are exaggerated compared to an actual physical thickness and interval for convenience of illustration. In the following description, detailed explanation of known related functions and constitutions may be omitted to avoid unnecessarily obscuring the subject manner of the present invention. Like reference numerals refer to like elements throughout the specification and drawings.

Figure 1B:
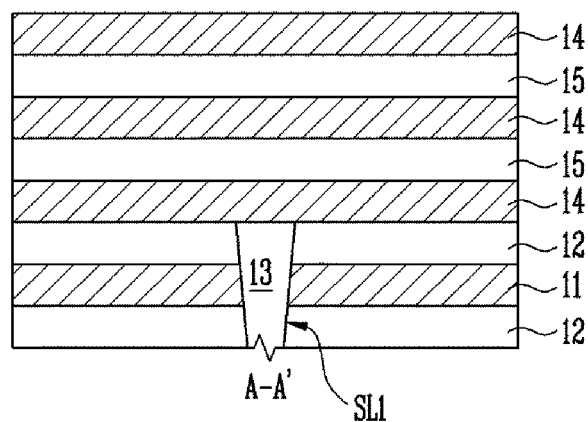
FIG. 1B is a cross-sectional view taken along line A-A' of FIG. 1A.
Figure 1C:
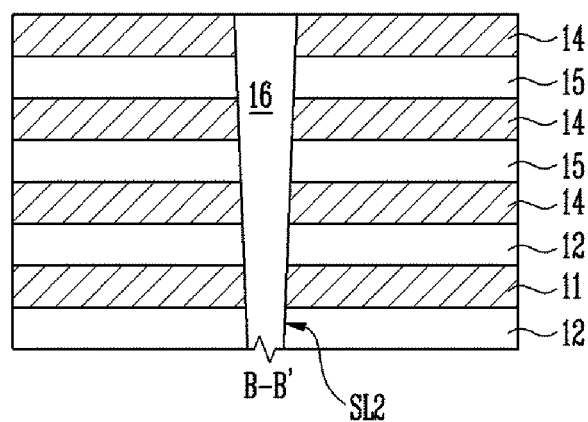
FIG. 1C is a cross-sectional view taken along line B-B' of FIG. 1A.

FIG. 1A is a layout view illustrating the structure of a semiconductor device according to an embodiment of the present invention. FIG. 1B is a cross-sectional view taken along line A-A' of FIG. 1A. FIG. 1C is a cross-sectional view taken along line B-B' of FIG. 1A.

As illustrated in FIGS. 1A to 1C, a semiconductor device according to an embodiment of the present invention may include a substrate (not illustrated), at least one first conductive layer 11, at least one first slit SL1, second conductive layers 14, a second slit SL2 and third slits SL3. A cell region CL and contact regions CT1 and CT2 may be defined in the substrate. The first conductive layer 11 may be stacked on the substrate and formed in at least one level. The first slit SL1 may pass through the first conductive layer 11. The second conductive layers 14 may be stacked on the first conductive layer 11. The second slit SL2 may be located in the cell region CL and connected with the first slit SL1 through the first and second conductive layers 11 and 14. The third slits SL3 may be located in the contact regions CT1 and CT2 and connected with the first slit SL1 through the first and second conductive layers 11 and 14.

Each memory block MB may include the cell region CL and the contact regions CT1 and CT2 that are located at either or both sides of the cell region CL. Memory cells may be formed in the cell region CL, and contact pads of word lines or selection lines stacked on top of one another may be located in the contact regions CT1 and CT2. For example, the cell region CL may be located between the contact regions CT1 and CT2.

The semiconductor device may further include a first insulating layer 13 filled in the first slit SL1, a second insulating layer 16 filled in the second slit SL2 and interlayer insulating layers 12 and 15 interposed between the first conductive layer 11 and the second conductive layers 14.

According to the above-described structure of the semiconductor device, the first conductive layer 11 may be divided into a plurality of patterns by the first to third slits SL1 to SL3. For example, the first conductive layer 11 may be divided into a plurality of line patterns. In addition, each of the second conductive layer 14 at each level may be connected through a region between the second and third slits SL2 and SL3.

For example, the semiconductor device may include vertically arranged strings. In this case, the first conductive layer 11 may be a lower selection gate, at least one uppermost second conductive layer 14, among the second conductive layers 14, may be an upper selection gate, and the other second conductive layers may be control gates. A lower selection gate on each layer may be patterned into a linear shape. On the other hand, since the control gates and the upper selection gate on respective layers may not include the first slit SL1, the control gates and the upper selection gate may be in the shape of a plate including openings formed by the second and third slits.

The semiconductor device may further include any one or a combination of channel layers CH, one or more fourth slits SL4, one or more fifth slits SL5, one or more sixth slits SL6 and one or more seventh slits SL7. The channel layers CH may be located in the cell region CL and pass through the first and second conductive layers 11 and 14. The fourth slits SL4 may be located between the channel layers CH. The fifth slits SL5 may be located in the contact regions CT1 and CT2 and connected with the fourth slits SL4 through the first and second conductive layers 11 and 14. The sixth slits SL6 may be located in the contact regions CT1 and CT2. The seventh slits SL7 may be located at boundaries between neighboring memory blocks MB and pass through the first and second conductive layers 11 and 14.

According to the above-described structure of the memory device, the first and second conductive layers 11 and 14 may be divided into units of the memory blocks MB. The first conductive layer 11 may have linear shapes separated by the first to fifth slits SL1 to SL5. For example, the first conductive layer 11 of each of the memory blocks MB may be first separated into two parts by the first to third slits SL1 to SL3 and then separated again by the fourth and fifth slits SL4 and SL5, thereby forming four line patterns. In addition, each of the second conductive layers 14 at each level may be connected through a region other than the second, third, fourth and sixth slits SL2, SL3, SL4 and SL6.

Various changes may be made to positions and shapes of the first to seventh slits SL7. Various layouts of a semiconductor device according to an embodiment of the present invention may be described below with reference to FIGS. 9A to 9C.

Figure 2A:
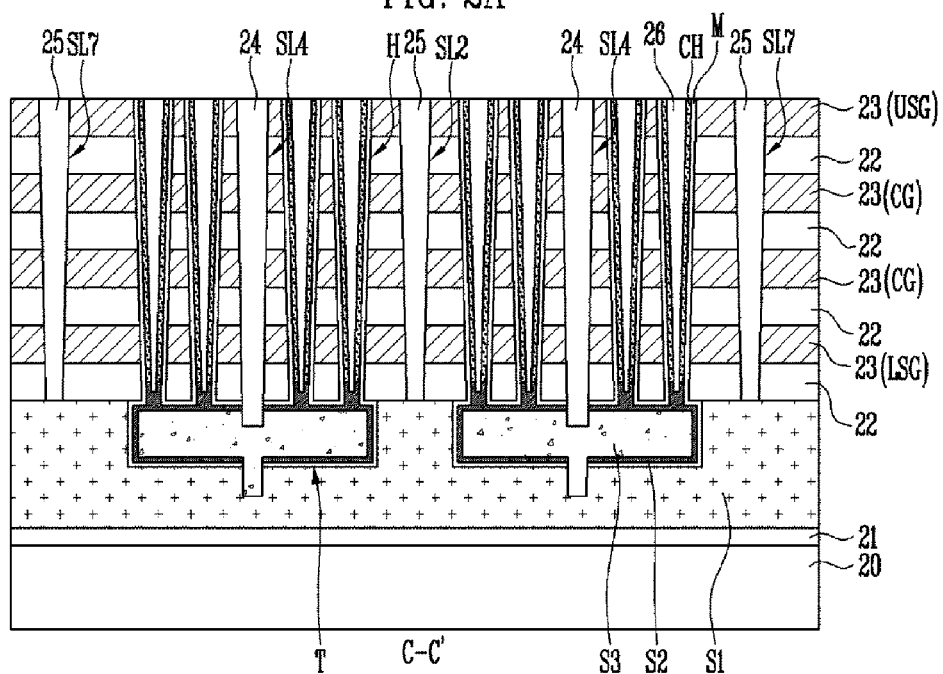
FIG. 2A is a cross-sectional view taken along line C-C' of FIG. 1A, illustrating a semiconductor device according to first embodiments of the present invention.

FIG. 2A is a cross-sectional view taken along line C-C' of FIG. 1A, illustrating a semiconductor device according to first embodiments of the present invention.

As illustrated in FIG. 2A, the semiconductor device according to the first embodiments of the present invention may include a substrate 20, an insulating layer 21 formed on the substrate 20, a first source layer S1 formed on the insulating layer 21, trenches T formed in the first source layer S1, second source layers S2 formed along inner surfaces of the trenches T and third source layers S3 formed in the second source layers S2.

In addition, the semiconductor device may further include conductive layers 23, the channel layers CH and memory layers M. The conductive layers 23 may be stacked on the first source layer S1. The channel layers CH may pass through the conductive layers 23 and be coupled to the second source layer S2. The memory layers M may surround outer surfaces of the channel layers CH and the second source layers S2.

The seventh slits SL7 may be deep enough to expose the first source layer S1. The second slit SL2 may be located between neighboring second source layers S2 and be deep enough to expose the first source layer S1. The second slit SL2 may be filled with an insulating layers 25. The fourth slits SL4 may be located between channel holes and deep enough to pass through the trench T. In this case, lower portions of the fourth slits SL4 may be filled with the third source layers S3 while the rest of the fourth slits SL4 are filled with the insulating layers 24. Therefore, the third source layer S3 may pass through the second source layer S2 and the memory layer M and contact the first source layer S1.

Interlayer insulating layers 22 may be interposed between the stacked conductive layers 23. In addition, each of the channel layers CH may have a tubular structure with an open central portion, or a pillar structure with a central portion completely filled. When each of the channel layers CH has a tubular structure, an open central portion may be filled with an insulating layer 26.

Each of the first and second source layers S1 and S2 may include a doped polysilicon layer, and the third source layer S3 may include a metal layer such as a tungsten layer. By forming a portion of the source layers with a metal layer, source resistance may be reduced.

At least one lowermost conductive layer 23, among the conductive layers 23, may be a lower selection gate LSG, at least one uppermost conductive layer 23 may be an upper selection gate USG, and the remaining conductive layers 23 may be control gates CG. In this manner, strings may be vertically arranged to improve a degree of integration of the memory device.

The memory layer M may include all or part of a tunnel insulating layer, a charge storing layer and a charge blocking layer. Here, the charge storing layer may include at least one of a floating gate such as a polysilicon layer, which can store charge, a trap layer such as a nitride layer, which can trap charge, and nanodots. For reference, the memory layer M may include a phase-change material layer instead of the charge storing layer.

In addition, though not illustrated in FIG. 2A, another memory layer may be further included so that this memory layer may be interposed between the memory layer M and the conductive layer 23 and surround top and bottom surfaces of the conductive layer 23. Here, the additional memory layer may include all or part of a tunnel insulating layer, a charge storing layer and a charge blocking layer. In addition, the charge blocking layer of the additional memory layer may be a stacked layer of an oxide layer and a material layer with a high dielectric constant.

Figure 2B:
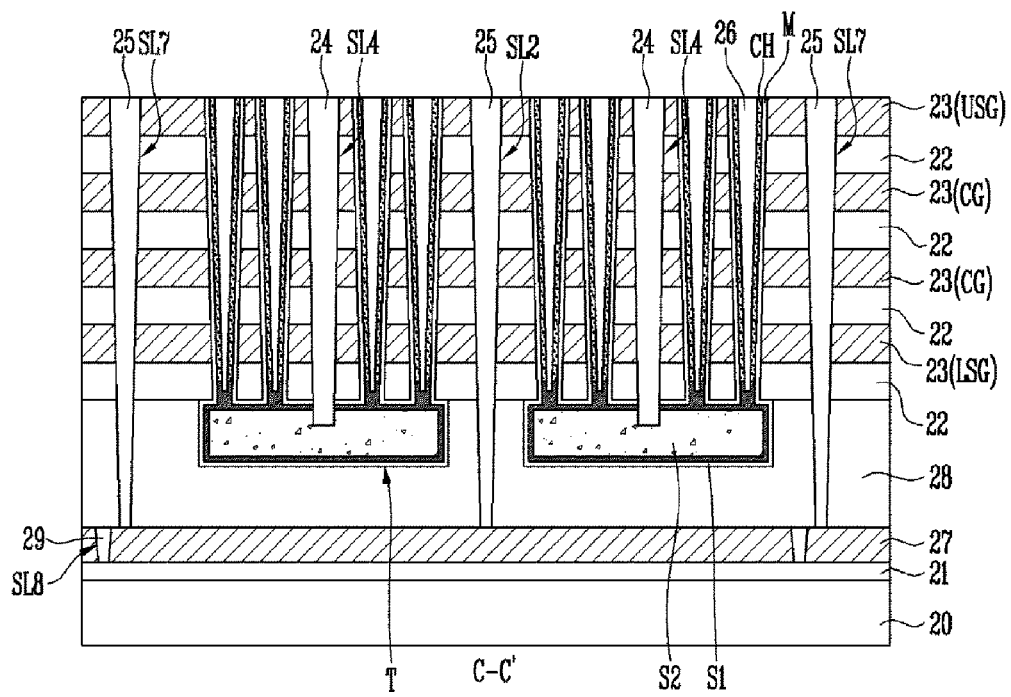
FIG. 2B is a cross-sectional view of a semiconductor device according to second embodiments of the present invention.

FIG. 2B is a cross-sectional view of a semiconductor device according to second embodiments of the present invention. Hereinafter, a description of the contents of the second embodiments of the same as those of the first embodiments is omitted.

As illustrated in FIG. 2B, the semiconductor device according to the second embodiments may include the substrate 20, the insulating layer 21 formed on the substrate 20, a first conductive layer 27 formed on the insulating layer 21, a buffer layer 28 formed on the first conductive layer 27, the trenches T formed in the buffer layer 28, the first source layers S1 formed along inner surfaces of the trenches T, the second source layers S2 formed in the first source layers S1, the second conductive layers 23 stacked on the buffer layer 28, the channel layers CH passing through the second conductive layers 23 and coupled to the first source layer S1 and the memory layers M surrounding outer surfaces of the channel layers CH and the first source layer S1. Here, the buffer layer 28 may include an insulating layer.

The fourth slits SL4 may be connected with the trench T. In this example, the first and second source layers S1 and S2 may be formed in the trench T and may not contact the buffer layer 28. The fourth slits SL4 may be deep enough to pass through the trench T. In this case, the second source layer S2 may pass through the first source layer S1 and the memory layer M and contact the buffer layer 28.

The second and seventh slits SL2 and SL7 may be deep enough to expose the first conductive layer 27. The first conductive layer 27 may function as an etch stop layer during an etch process performed to form the and seventh slits SL2 and SL7.

For reference, the first conductive layer 27 may be formed in a peripheral region (not illustrated) as well as in the cell region CL. The first conductive layer 27 formed in the peripheral region may be a gate electrode of a transistor. For example, the insulating layer 21 and the first conductive layer 27 may be sequentially formed on the substrate 20 including the cell region CL and the peripheral region. Subsequently, the first conductive layer 27 may be etched to form eighth slits SL8, and insulating layers 29 may be formed in the eighth slits SL8. As a result, a gate electrode of a transistor may be located in the peripheral region, and the first conductive layer 27 located in the cell region may be divided into units of the memory blocks MB. The seventh slit SL7 and the eighth slit LS may be located at a boundary between neighboring memory blocks MB and staggered with each other.

Figure 2C:
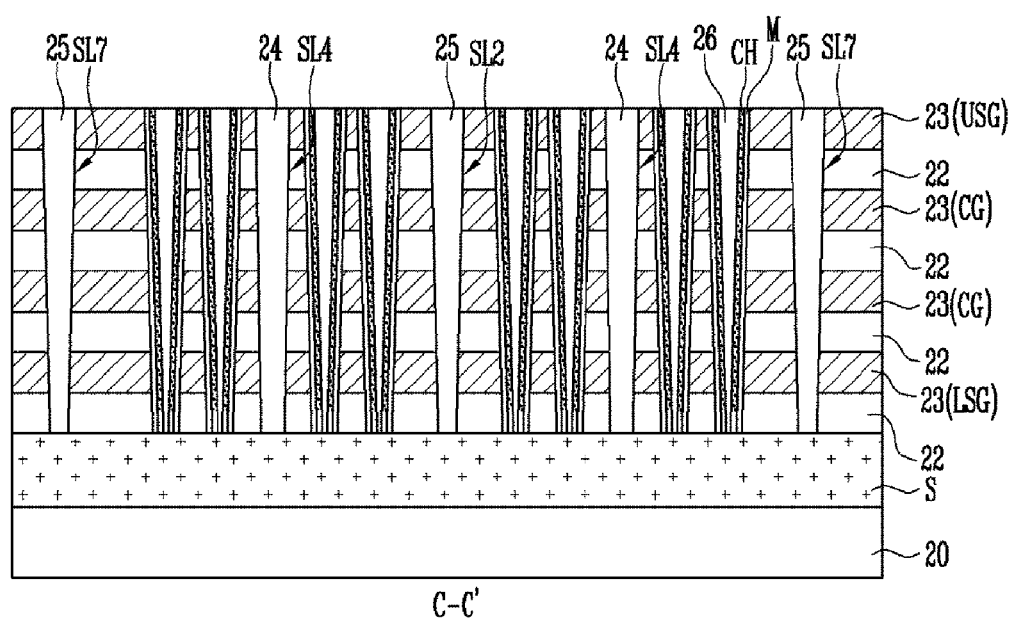
FIG. 2C is a cross-sectional view of a semiconductor device according to third embodiments of the present invention.

FIG. 2C is a cross-sectional view of a semiconductor device according to third embodiments of the present invention. Hereinafter, a description of the contents of the third embodiments of the same as those of the first and second embodiments is omitted.

As illustrated in FIG. 2C, the semiconductor device according to the third embodiments of the present invention may include a source layer S, the conductive layers 23 stacked on the source layer S, the channel layers CH passing through the conductive layers 23 and coupled to the source layer S, and the memory layers M surrounding outer surfaces of the channel layers CH.

Here, the source layer S may be formed by implanting impurities into the substrate 20 or include a separate conductive layer. In addition, the second, fourth and seventh slits S2, S4 and S7 may be deep enough to expose the source layer S.

FIGS. 3A to 8C are layout views or cross-sectional views illustrating a method of manufacturing a semiconductor device according to the first embodiments of the present invention. Here, the layout views illustrate layouts of the cross-sectional views at heights of I-I' or II-II', and the cross-sectional views illustrate cross-sections taken along lines C-C', D-D' and E-E' of the layout views.

Figure 3A:
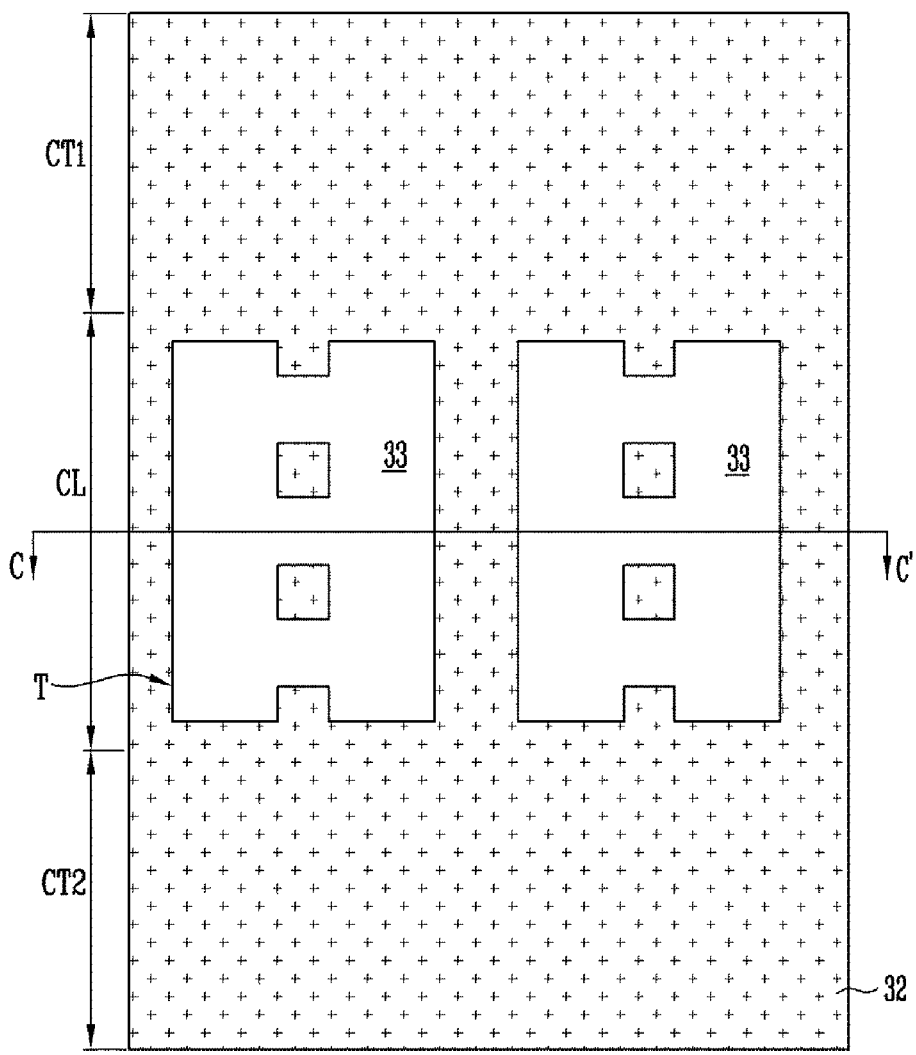
Figure 3B:
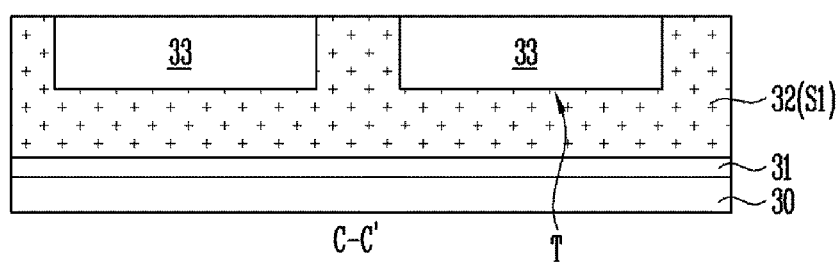

As illustrated in FIGS. 3A and 3B, an insulating layer 31 may be formed on a substrate 30 in which the cell region CL and the contact regions CT1 and CT2 are defined. Here, the insulating layer 31 may electrically separate the first source layer 32 from the substrate 30 and include an oxide layer.

Subsequently, a first source layer 32 may be formed on the insulating layer 31, and the first source layer 32 may be etched to form the trenches T. Here, the first source layer 32 may be a polysilicon layer doped with impurities. For example, the first source layer 32 may be a polysilicon layer doped with N type or P type impurities.

Each of the trenches T may define a region where the second source layer S2 and the third source layer S3 are formed during subsequent processes. The trenches T may be located in the cell region CL of each memory block MB. Each of the trenches T may include an island pattern, a line pattern, or a combination thereof. In this embodiment, the trench T may be shaped like a ladder including line trenches and island trenches that coupe the line trenches.

Subsequently, sacrificial layers 33 may be formed in the trenches T. For example, each of the sacrificial layers 33 may be a nitride layer (SiN) or a titanium nitride layer (TiN).

Figure 4A:
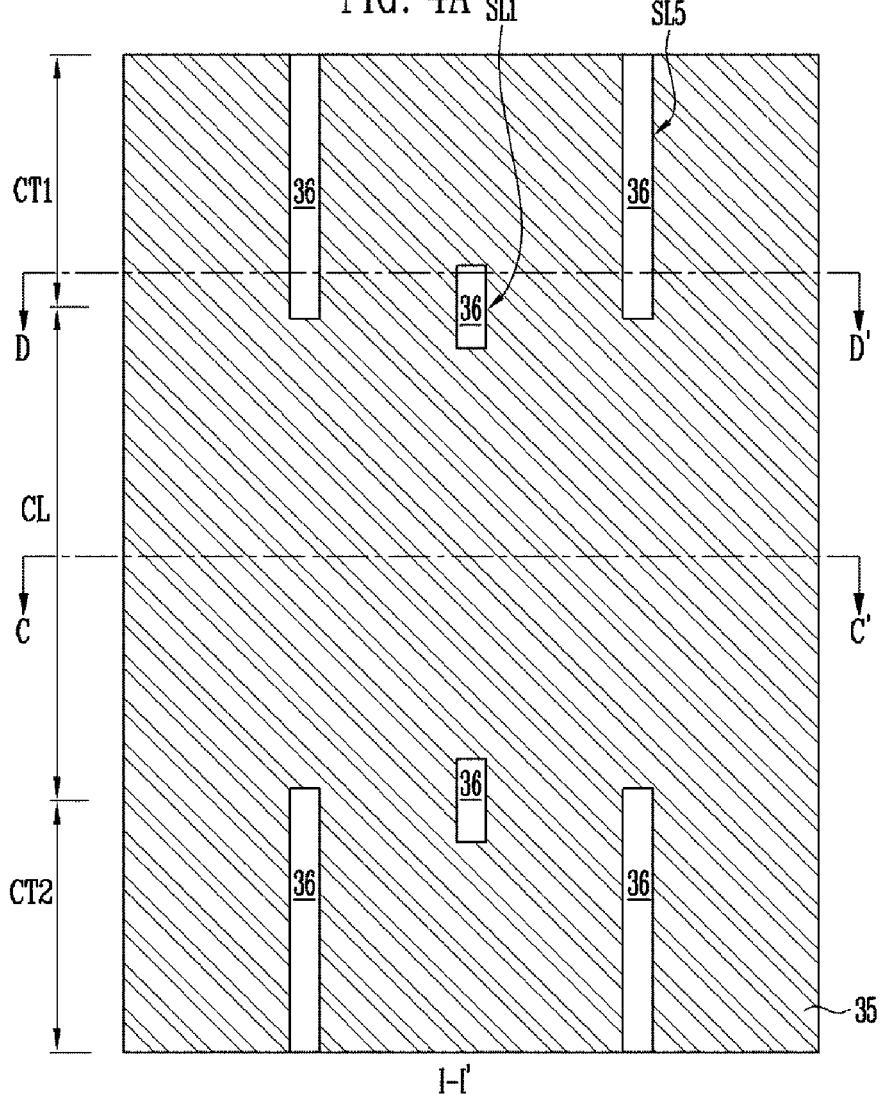
Figure 4B:
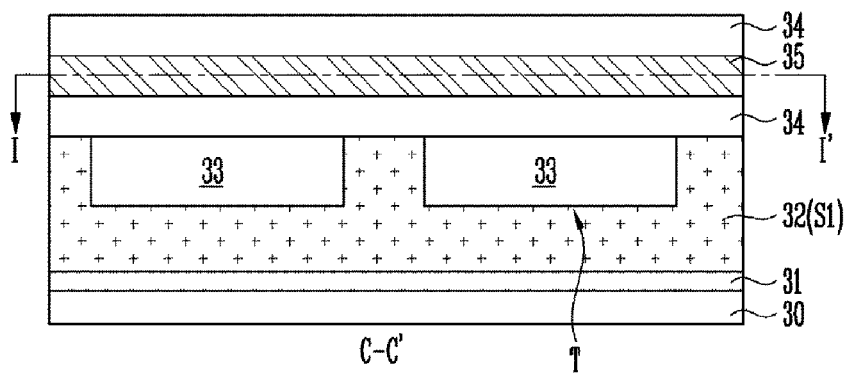
Figure 4C:
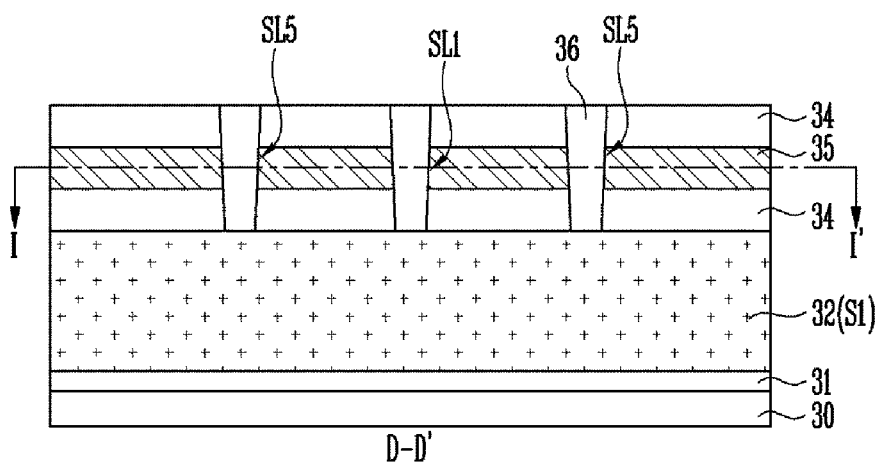

As illustrated in FIGS. 4A to 4C, at least one first material layer 35 and second material layers 34 may be formed alternately with each other over the first source layer 32. The first material layer 35 may be configured to form a conductive layer configured as a lower selection gate. The second material layer 34 may separate the stacked conductive layers from each other.

The first material layer 35 and the second material layer 34 may be formed of materials having a high etch selectivity therebetween. For example, the first material layer 35 may include a conductive layer such as a polysilicon layer, and the second material layer 34 may include an insulating layer such as an oxide layer. In another example, the first material layer 35 may include a conductive layer such as a doped polysilicon layer or a doped amorphous silicon layer. The second material layer 34 may include a sacrificial layer such as an undoped polysilicon layer and an undoped amorphous silicon layer. In yet another example, the first material layer 35 may include a sacrificial layer such as a nitride layer, and the second material layer 34 may include an insulating layer such as an oxide layer.

In this embodiment, a description will be made in reference to a case in which the first material layer 35 includes a sacrificial layer, and the second material layer 34 includes an insulating layer.

Subsequently, the first material layer 35 and the second material layers 34 may be etched to form one or more first slits SL1 and one or more fifth slits SL5. The first and fifth slits SL1 and SL5 may be filled with insulating layers 36. The first and fifth slits SL1 and SL5 may be deep enough to expose the first source layer 32. In addition, the first slit SL1 may be formed in the cell region CL or the contact regions CT1 and CT2, and the fifth slits SL5 may be formed in the contact regions CT1 and CT2.

Figure 5A:
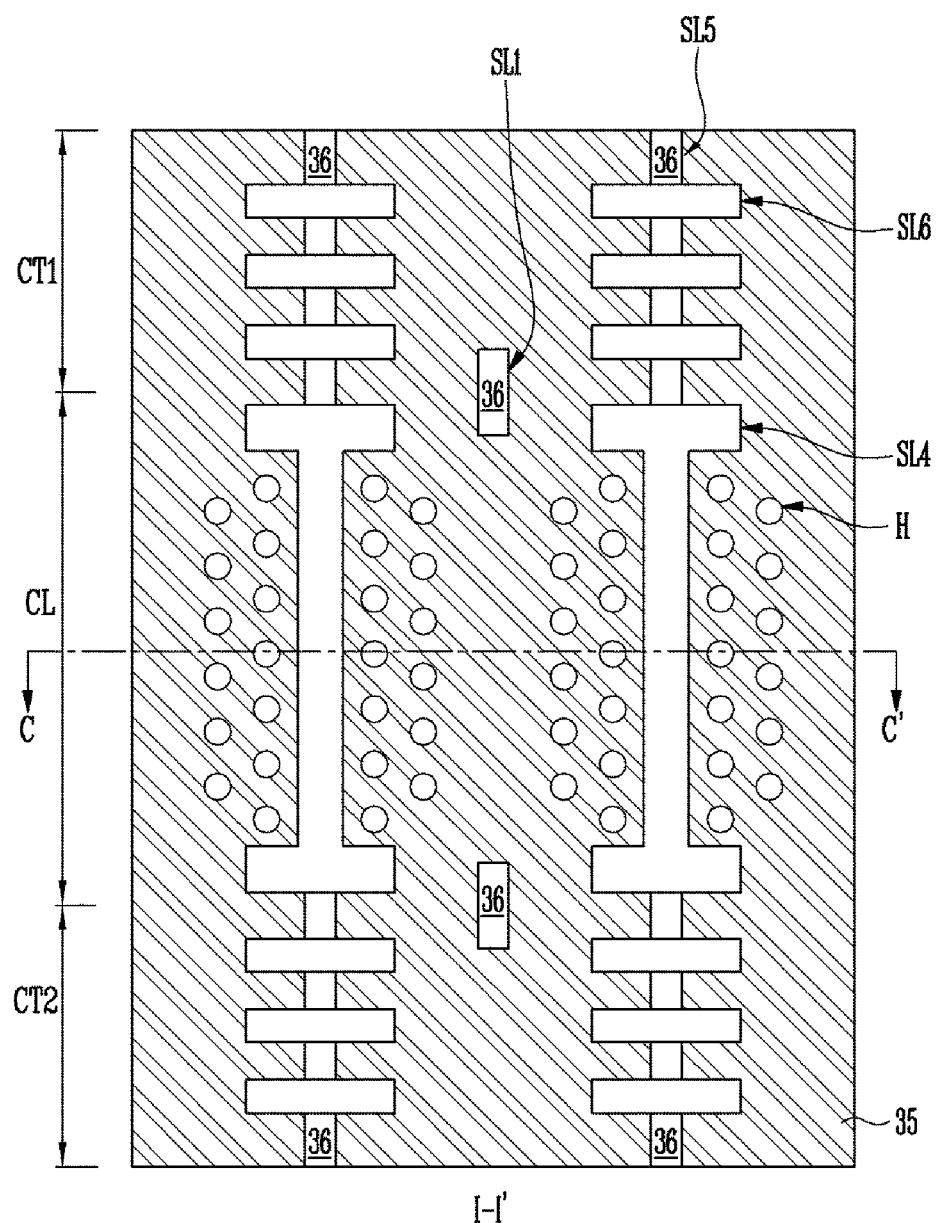
Figure 5B:
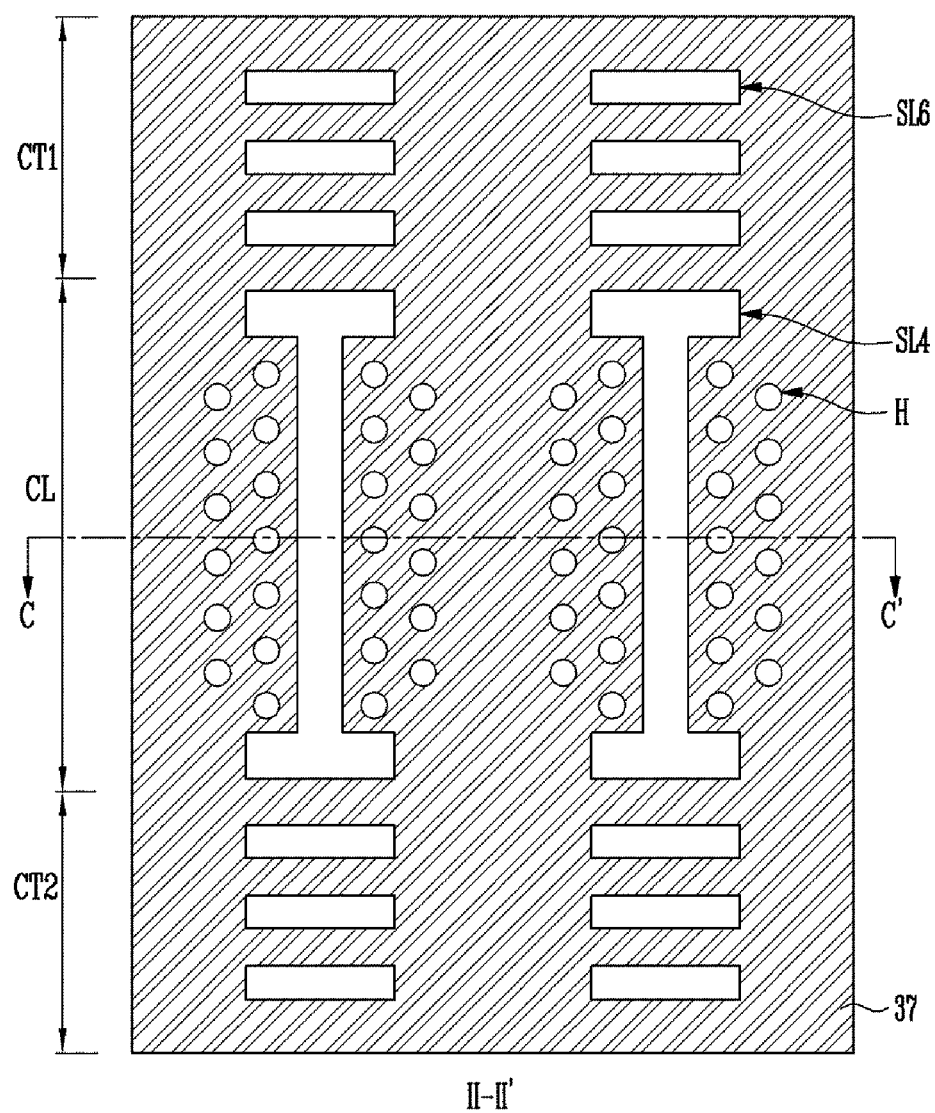
Figure 5C:
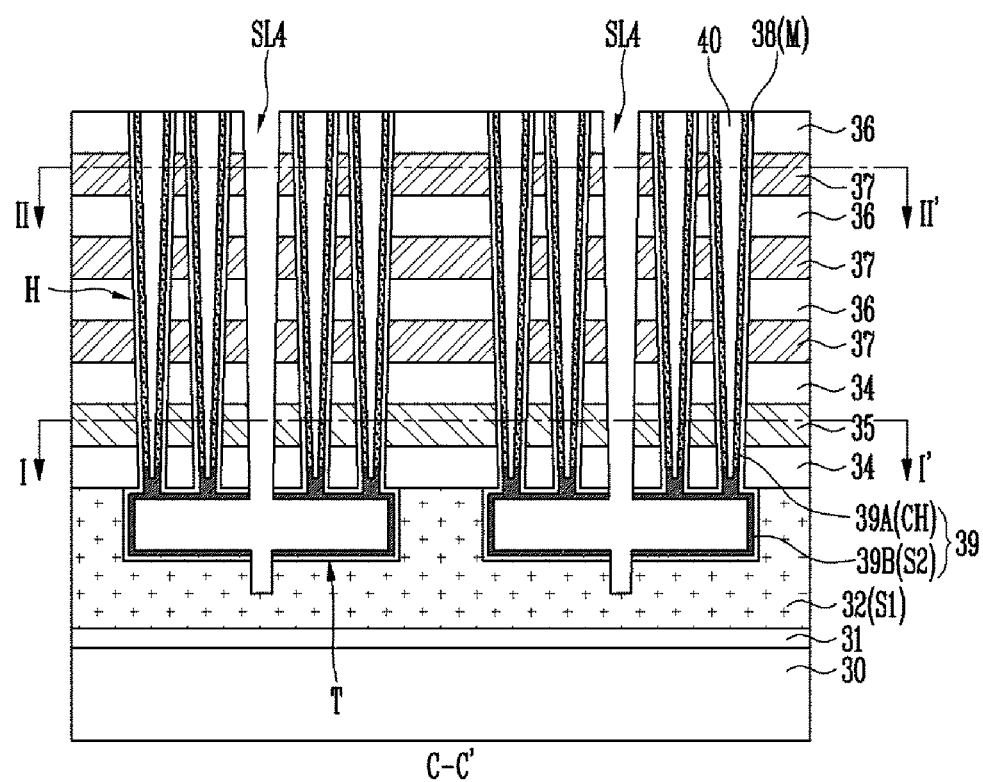

As illustrated in FIGS. 5A to 5C, third material layers 37 and fourth material layers 36 may be formed alternately with other over the first and second material layers 35 and 34. Here, the third material layers 37 may be formed of the same material as that of the first material layers 35, and the fourth material layers 36 may be formed of the same material as the third material layers 37.

Subsequently, the first to fourth material layers 34 to 37 may be etched to form channel holes H so that the channel holes H may be connected with the trench T. The channel holes H may be tapered from top to bottom. The channel holes H may be arranged in a matrix format or a staggered pattern. For illustration purposes, four channel holes H are depicted as located in the same cross-section. The number of channel holes H coupled to each trench T may vary depending on a degree of integration of the memory device.

Subsequently, the sacrificial layers 33 (see FIG. 4B) exposed on bottom surfaces of the channel holes H may be removed, and memory layers 38 may be formed along inner surfaces of the trenches T and the channel holes H. The memory layers 38 may be formed to store data therein. Each of the memory layers 38 may include all or part of a charge blocking layer, a charge storing layer and a tunnel insulating layer.

Subsequently, a semiconductor layer 39 may be formed on the memory layer 38. For example, the semiconductor layer 39 may include a polysilicon layer dope with no impurities. Since widths of the channel holes H are reduced from top to bottom, connecting portions of the trench T and the channel holes H may be completely sealed before the trench T is completely filled with the semiconductor layer 39. Therefore, empty space may be formed in the trench T. In addition, the channel holes H may not be completely filled with the semiconductor layer 39, but central portions thereof may remain empty. In this case, an insulating layer 40 may be formed substantially in the central portion of the semiconductor layer 39.

Subsequently, the fourth slits SL4 may be formed through each of the trenches T. For example, the first to fourth material layers 34 to 37, the memory layer 38 and the semiconductor layer 39 may be etched, and the first source layer 32 may be subsequently etched to a predetermined depth, so that the fourth slits SL4 may be formed. Each of the fourth slits SL4 may be located substantially at the center of the trench T, and an end of the fourth slits SL4 may be widened to substantially form an I-shape.

For reference, the sixth slits SL6 may be formed at the same time or substantially the same time as the fourth slits SL4 are formed. The sixth slits SL6 may be located in the contact regions CT1 and CT2 of each memory block MB. For example, each of the sixth slits SL6 may substantially have a linear shape extending in one direction, a linear shape having at least one protruding portion, or a "U" shape. In addition, when the first source layer 32 includes an insulating layer, the fourth slit SL4 may be deep enough to be coupled to the trench T (refer to second embodiment).

Subsequently, the semiconductor layer 39 in the trench T may be doped with impurities through the fourth slit SL4 to form a second source layer 39B. For example, the second source layer 39B may be formed by doping the semiconductor layer 39 in the trench T with N type or P type impurities by performing a plasma doping process. In another example, the second source layer 39B may be formed by forming an oxide layer doped with impurities on the semiconductor layer 39 and diffusing the impurities, included in the oxide layer, into the semiconductor layer 39 by thermal treatment, and the oxide layer may be subsequently removed. In this manner, a horizontal region of the semiconductor layer 39 formed in the trench may be the second source layer 39B, and a vertical region of the semiconductor layer 39 passing through the stacked layers may be a channel layer 39A.

Figure 6A:
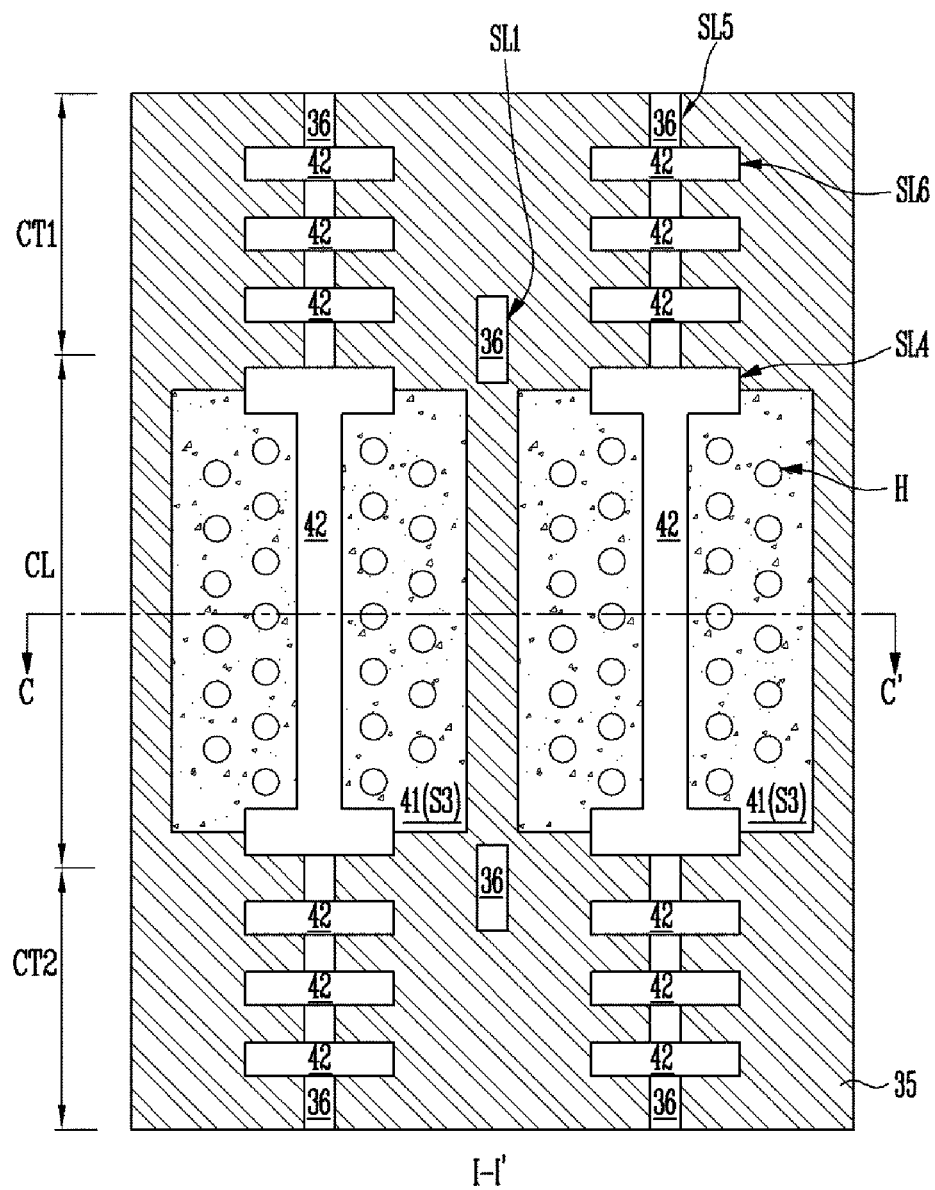
Figure 6B:
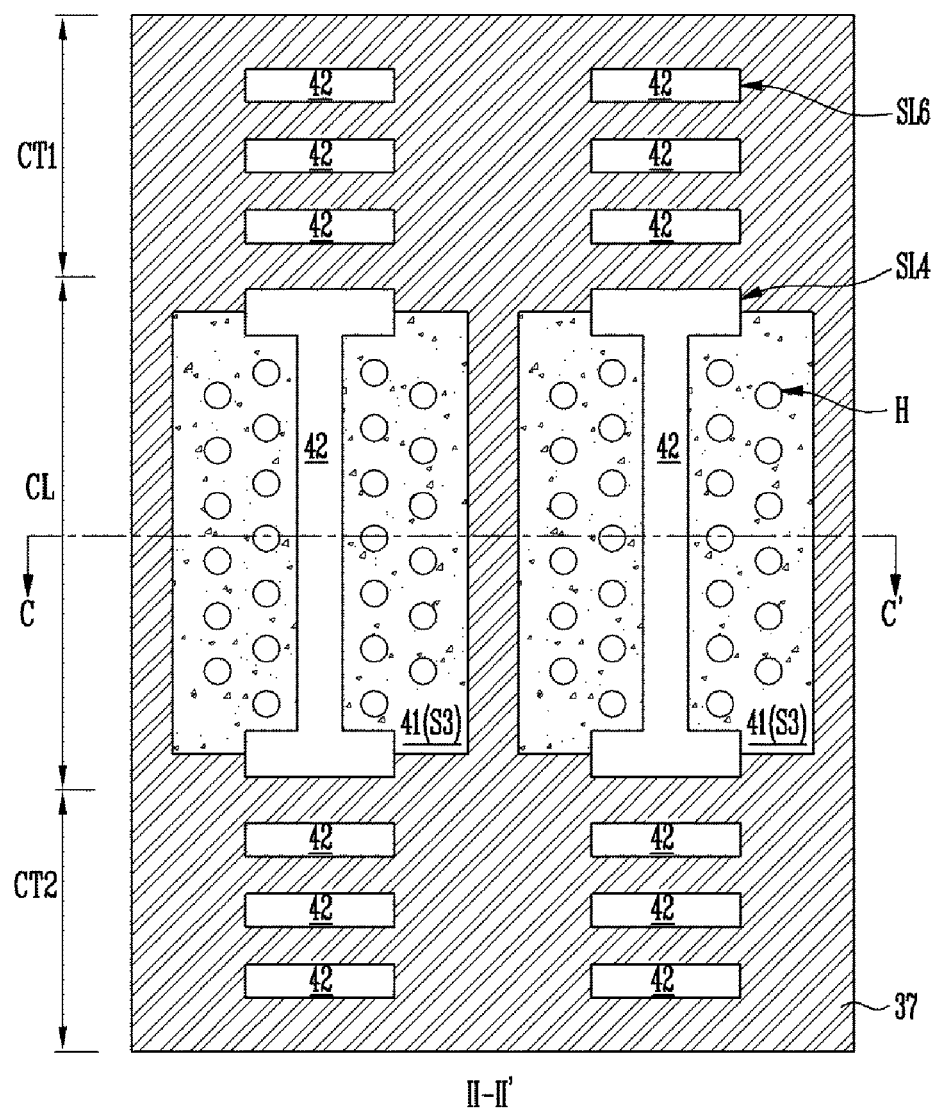
Figure 6C:
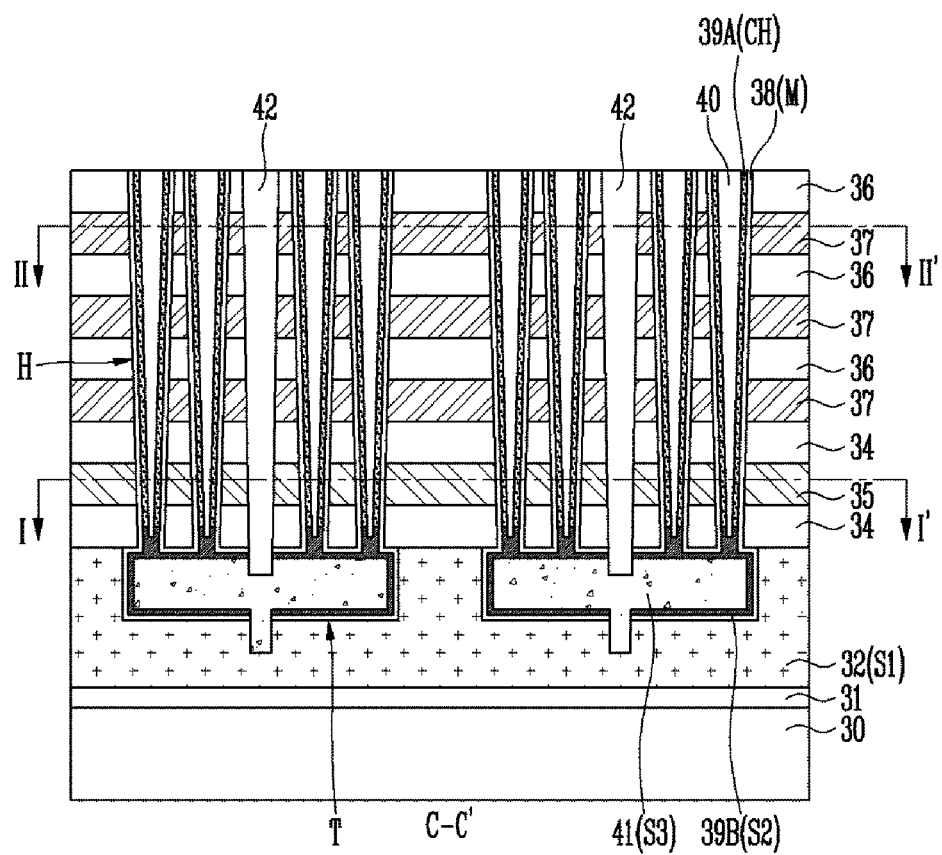

As illustrated in FIGS. 6A to 6C, a third source layer 41 may be formed in the second source layer 39B and a lower portion of the fourth slit SL4. For example, a barrier layer may be formed along an inner surface of the trench T, in which the second source layer 39B is formed, and an inner surface of the fourth slit SL4, and a metal layer may be subsequently formed. Subsequently, the barrier layer and the metal layer formed in regions other than those in the first and second source layers 32 and 39B may be removed to form the third source layer 41. The barrier layer may be any one or a combination of a titanium layer (Ti) and a titanium nitride layer (TiN). The metal layer may include a tungsten layer (W). In addition, when the barrier layer and the metal layer are etched, if the tungsten layer formed in the lower portion of the fourth slit SL4 is disconnected from the tungsten layer formed in the second source layer 39B, the disconnected tungsten layers may be connected together again by growing the tungsten layer by using a selective growth process.

Subsequently, an insulating layer 42 may be formed in the fourth slit SL4. Here, the sixth slits SL6 may also be filled with the insulating layer 42. Here, the insulating layer 42 may be an oxide layer formed using High Temperature Oxidation (HTO) or High Density Plasma (HDP), or an oxide layer such as an Spin On Dielectric (SOD) layer or a polysilazane (PSZ) layer.

For reference, though illustrated in FIGS. 6A to 6C, before the fourth slit SL4 is formed, the contact regions CT1 and CT2 may be patterned stepwise by etching the first to fourth material layers 34 to 37. For example, the contact regions CT1 and CT2 may be patterned stepwise such that at least one pair of the first and second material layers 35 and 34 or at least one pair of the third and fourth material layers 37 and 36 may form a single tier. Subsequently, an insulating layer 45 (see FIG. 8C) may be formed over the entire stepwise-patterned resultant.

The time when the contact regions CT1 and CT2 are patterned stepwise may change according to the order in which the fourth and sixth slits SL4 and SL6 are formed. For example, when the fourth slit SL4 and the sixth slit SL6 are formed at the same time, the contact regions CT1 and CT2 may be patterned stepwise before the fourth and sixth slits SL4 and SL6 are formed. In another example, when the sixth slit SL6 is formed after the fourth slit SL4 is formed, the contact regions CT1 and CT2 may be patterned stepwise before the sixth slit SL6 is formed.

As illustrated in FIGS. 7A to 7D, the first to fourth material layers 34 to 37 may be etched to form the second slit SL2 and the third slit SL3. The second slit SL2 may be located in the cell region CL and connected with the first slit SL1. The third slit SL3 may be located in the contact regions CT1 and CT2 and connected with the first slit SL1. The second and third slits SL2 and SL3 may pass through the first to fourth material layers 34 to 37 and connected with the first slit SL1.

For reference, when the second and third slits SL2 and SL3 are formed, at least one seventh slit SL7 may be further formed so that the seventh slit SL7 may be located at a boundary between neighboring memory blocks MB. Here, the seventh slit SL7 may be deep enough to pass through the first to fourth material layers 34 to 37.

Figure 7A:
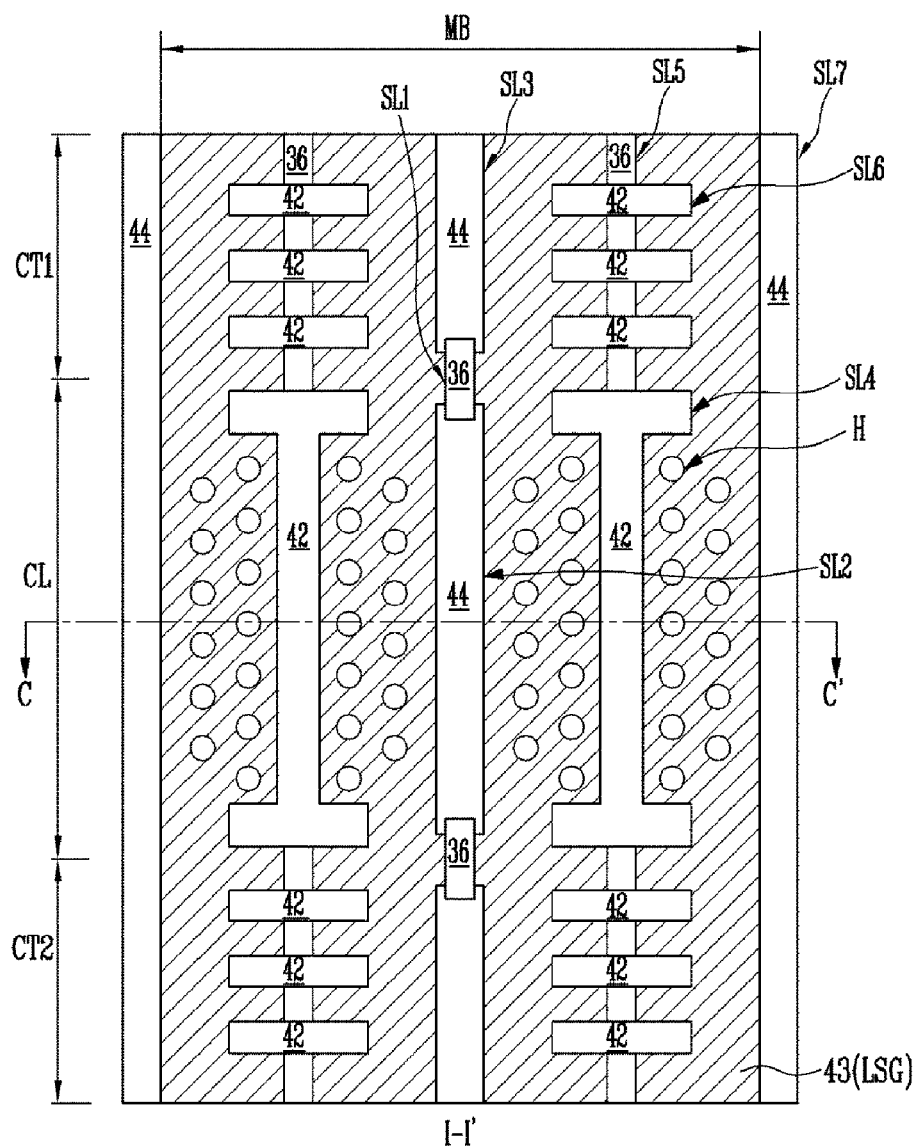
Figure 7C:
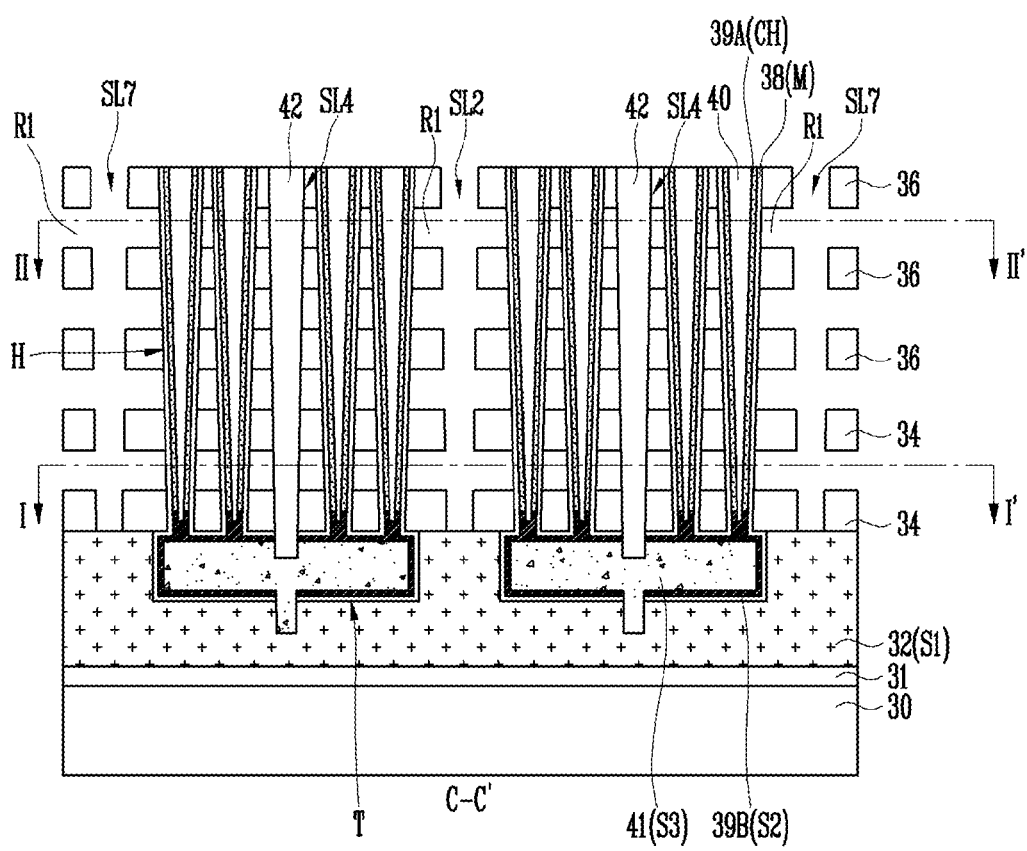
Figure 7D:
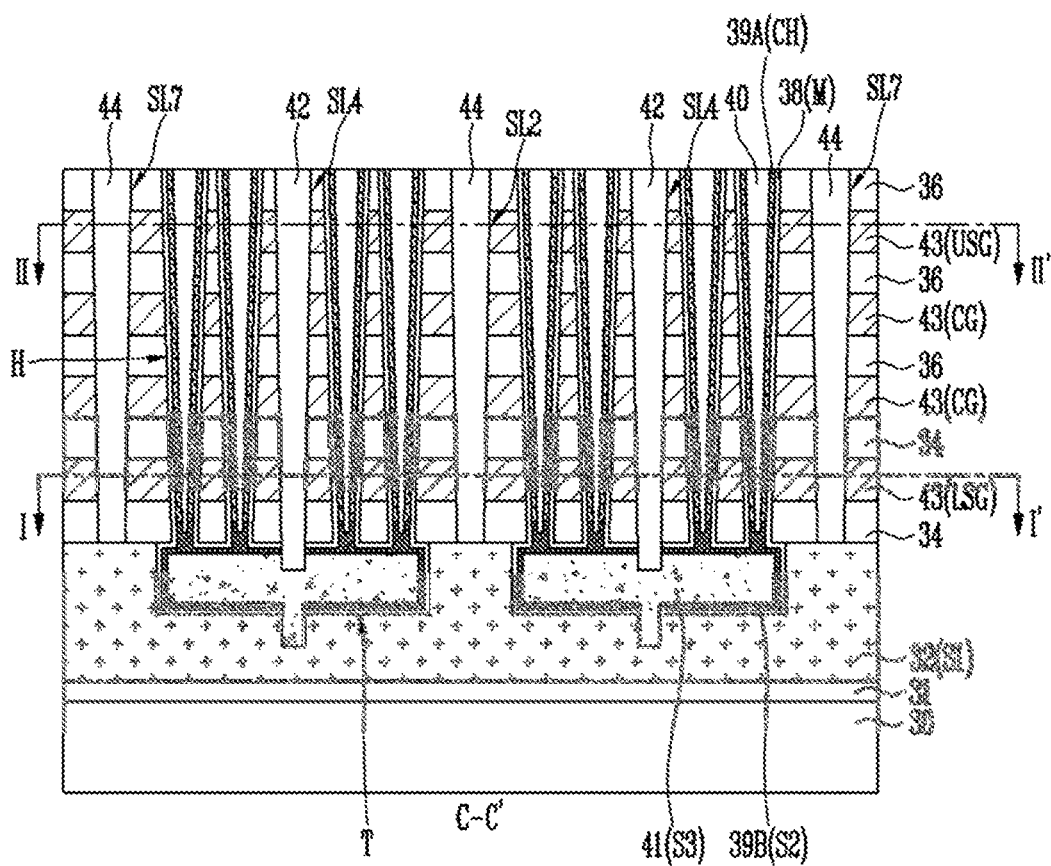

Subsequently, the first and third material layers 35 and 37 exposed through the second, third and seventh slits SL2, SL3 and SL7 may be etched to form first recessed regions R1 as shown FIG. 7C. Since the first and third material layers 35 and 37 are etched with the first, fourth and fifth slits SL1, SL4 and SL5 filled with the insulating layers 36 and 42, the remaining second and fourth material layers 34 and 36 may be prevented from tilting to one side or collapsing.

Subsequently, conductive layers 43 may be formed in the first recessed regions R1. See FIG. 7D. For reference, memory layers including charge blocking layers may be further formed in the first recessed regions R1 before the conductive layers 43 are formed.

Subsequently, insulating layers 44 may be formed in the second, third and seventh slits SL2, SL3 and SL7. At this time, an air gap may be formed in the second, third and seventh slits SL2, SL3 and SL7 by controlling deposition conditions.

Figure 8C:
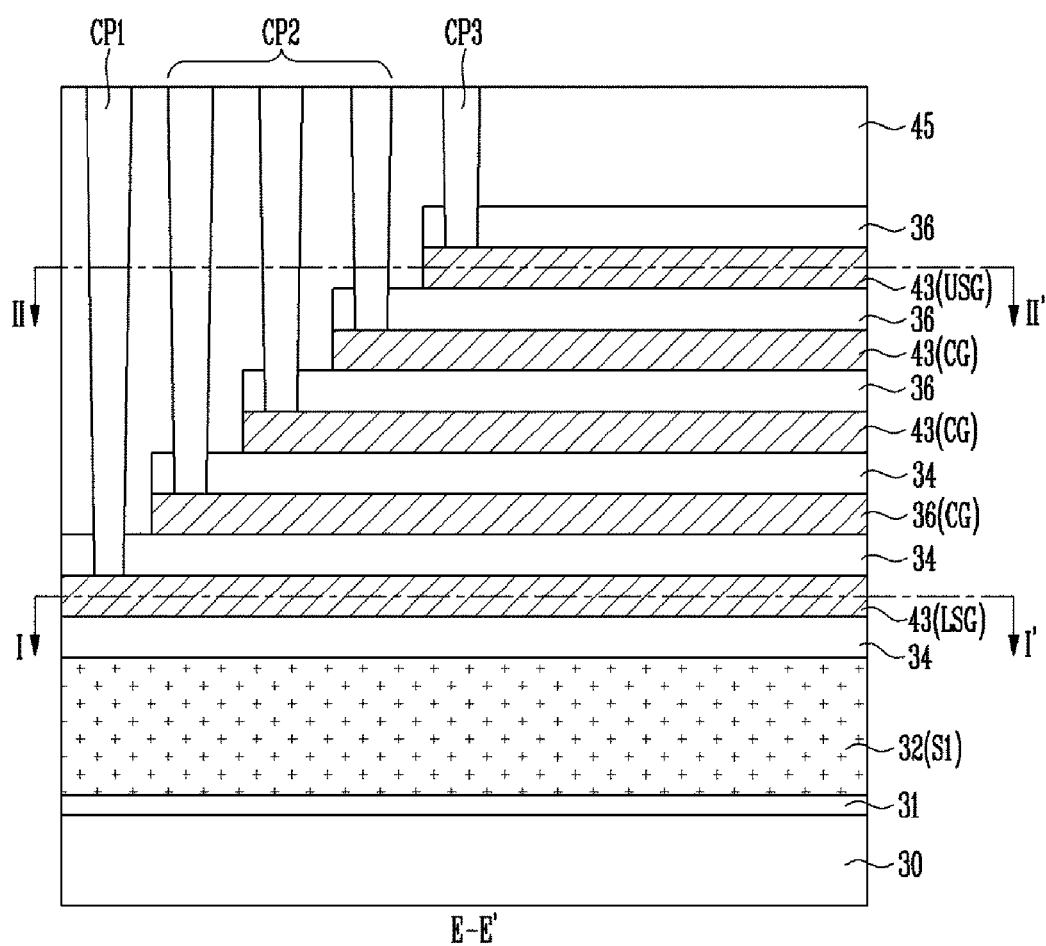

As illustrated in FIGS. 8A to 8C, first to third contact plugs CP1 to CP3 may be formed such that the first to third contact plugs CP1 to CP3 may be coupled to the conductive layers 43. In addition, a fourth contact plug CP4 may be formed such that the fourth contact plug CP4 may be coupled to the third source layer 41 through the fourth slit SL4.

The first contact plug CP1 may pass through the insulating layers 45 and 36 and be coupled to the conductive layer 43 configured as a lower selection gate. The second contact plugs CP2 may pass through the insulating layers 45 and 36 and be coupled to the conductive layer 43 configured as a control gate. The third contact plug CP3 may pass through the insulating layers 45 and 36 and be coupled to the conductive layer 43 configured as an upper selection gate. In addition, the second contact plugs CP2 may be formed between the sixth slits SL6. The shapes and positions of the sixth slits SL6 may determine positions where the second contact plugs CP2 are formed.

As a result, the semiconductor device including the first to third source layers 32, 39B and 41 may be manufactured. According to the above-described processes, the first and fifth slits SL1 and SL5 may be formed first, then the fourth and sixth slits SL4 and SL6 and finally the second, third and seventh slits SL2, SL3 and SL7. Therefore, the first material layer 35 configured as a lower selection gate may be patterned into a linear shape by using a self-aligned process. In addition, since the third material layers 37 configured as a control gate and an upper selection gate do not include the first and fifth slits SL1 and SL5, the third material layers 37 may be formed as continuous layers. In other words, by using a self-aligned process, the stacked layers may be formed into various patterns.

The above-described manufacturing processes may be partly changed according to types of the first to fourth material layers 34 to 37.

For example, the first and third material layers 35 and 37 may include conductive layers, and the second and fourth material layers 34 and 36 may include interlayer insulating layers. In this example, after the second, third and seventh slits SL2, SL3 and SL7 are formed, a process of siliciding the exposed first and third material layers 35 and 37 may be further performed. Processes of forming first recessed regions may be omitted.

In another example, the first and third material layers 35 and 37 may include conductive layers, and the second and fourth material layers 34 and 36 may include sacrificial layers. In this case, instead of forming first recessed regions, the second and fourth material layers 34 and 36 exposed through the second, third and seventh slits SL2, SL3 and SL7 may be etched to form second recessed regions. Subsequently, the second recessed regions and the second, third and seventh slits SL2, SL3 and SL7 may be filled with the insulating layers 44. As described above, after these slits are formed, a process of siliciding the first and third material layers 35 and 37 exposed through the slits may be further performed.

For reference, a method of manufacturing the semiconductor device according to the first embodiments has been described in the specification. However, by applying this manufacturing method, the semiconductor devices according to the second and third embodiments of the present invention may be manufactured. The semiconductor device according to the second embodiments may be manufactured by controlling depths at which the fourth slits SL4 are formed. In addition, the semiconductor device according to the third embodiments may be manufactured by omitting the processes of forming the trenches T, the sacrificial layer 33, the fourth slits SL4 and the second and third source layers 39B and 41. When the semiconductor device according to the third embodiments are manufactured, the fourth slits SL4 may be further formed when the sixth slits SL6 are formed, and the insulating layers 42 may be formed in the fourth slits SL4. In this case, the fourth slits SL4 may have substantially the same depth as the sixth slits SL6.

Figure 9A:
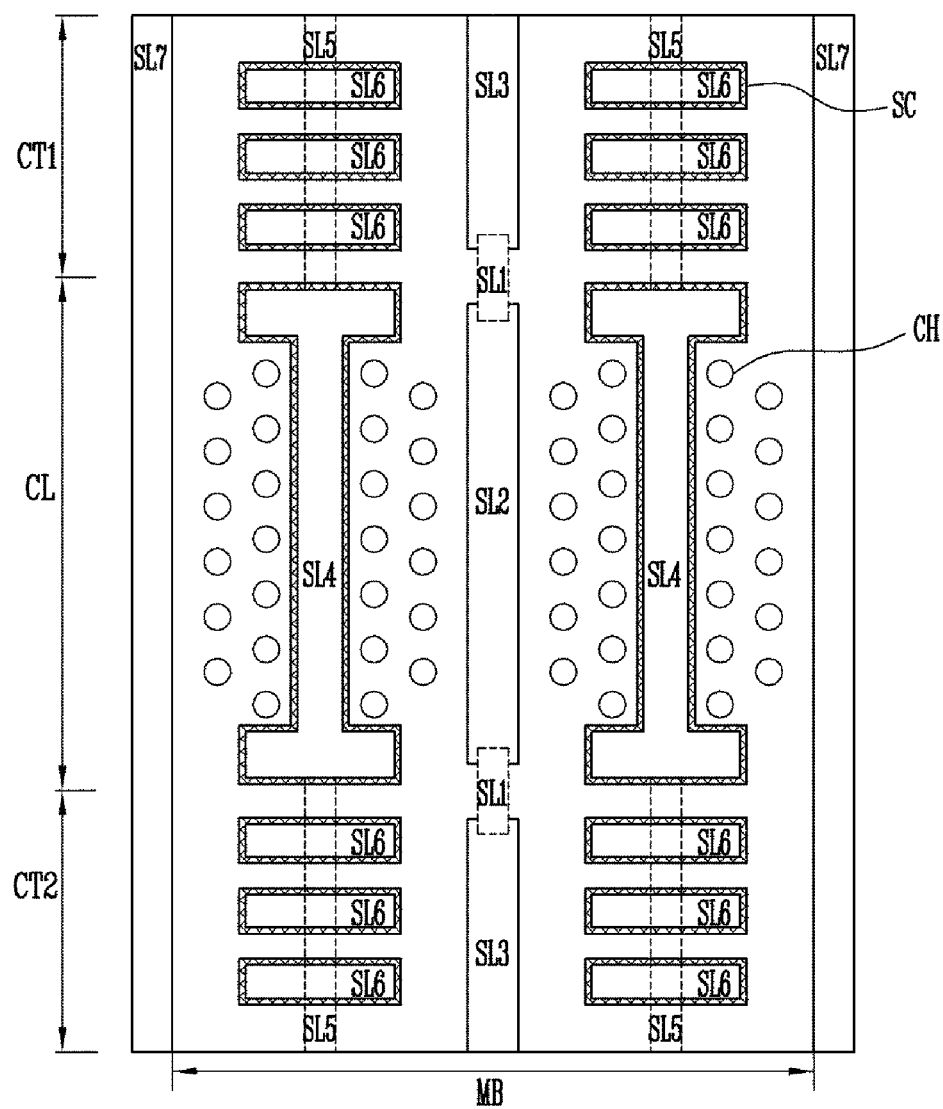
FIGS. 9A to 9C are layout views illustrating the structure of a semiconductor device according to an embodiment of the present invention.

FIG. 9A is a layout view illustrating the structure of a semiconductor device according to an embodiment of the present invention. Hereinafter, a description of the contents of this embodiment the same as those of the first, second and third embodiments is omitted.

As illustrated in FIG. 9A, the semiconductor device according to these embodiments of the present invention may include silicide layers SC formed by siliciding the conductive layers 43 around the fourth and sixth slits SL4 and SL6 by a predetermined thickness.

For example, when the first and third material layers 35 and 37 include conductive layers such as polysilicon layers, and the second and fourth material layers 34 and 36 include insulating layers such as oxide layers, the first and third material layers 35 and 37 exposed through the slits SL1 to SL7 may be silicided to form the silicide layers SC.

In these embodiments, a description has been in reference to a case in which the exposed first and third material layers 35 and 37 may be silicided after the fourth and sixth slits SL4 and SL6 are formed. Alternatively, a siliciding process may be performed after the first and fifth slits SL1 and SL5 are formed or after the second, third and seventh slits SL2, SL3 and SL7 are formed.

Figure 9B:
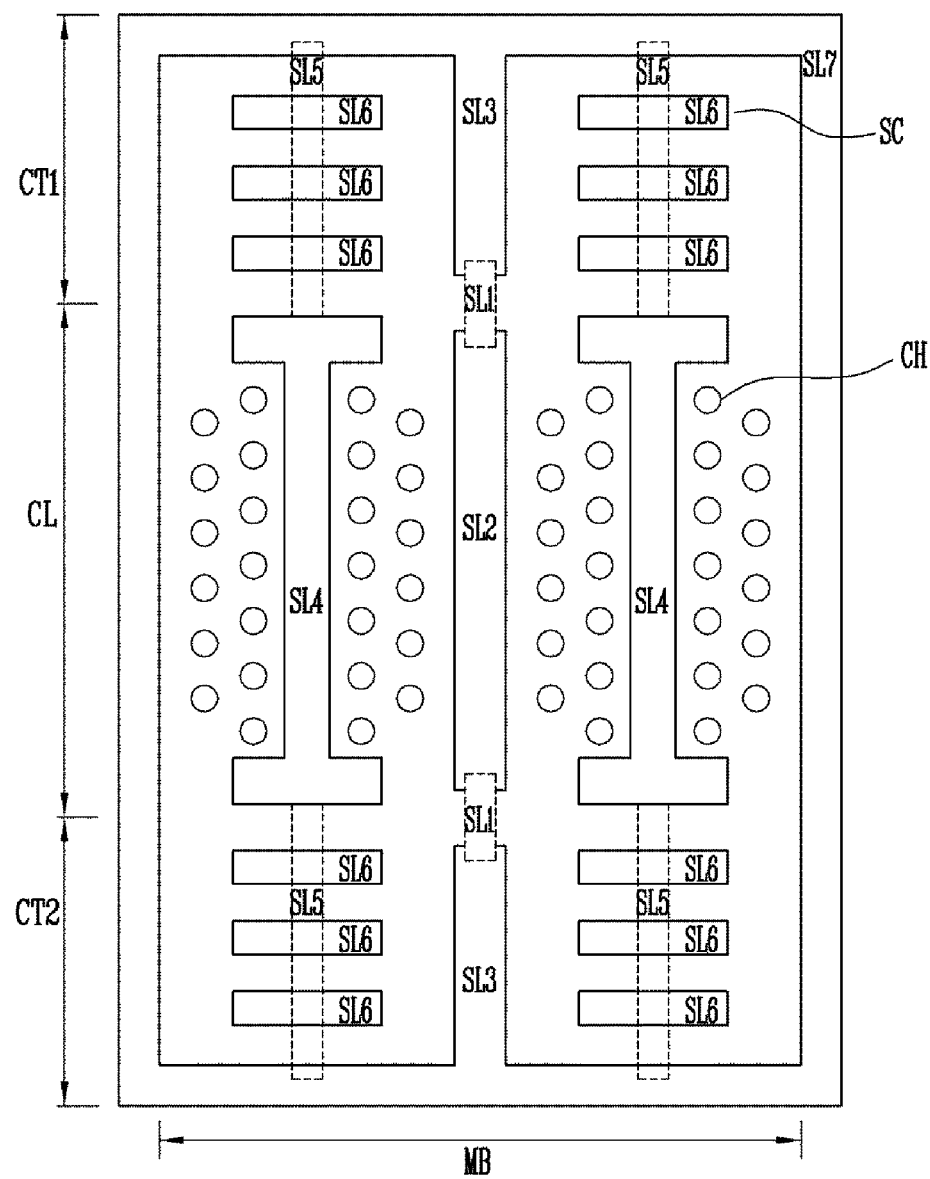

FIG. 9B is a layout view illustrating the structure of a semiconductor device according to an embodiment of the present invention. Hereinafter, a description of the contents of these embodiments the same as the previous embodiments is omitted.

As illustrated in FIG. 9B, the semiconductor device according to these embodiments of the present invention may include the seventh slit SL7 formed around the memory block MB. For example, the seventh slit SL7 may have a substantially square shape. In this case, the seventh slit SL7 may be connected with the third and fifth slits SL3 and SL5. Therefore, a lower selection gate may be first separated by the first to third and seventh slits S1 to S3 and S7 and then further separated by the fourth, fifth and seventh slits SL4, SL5 and SL7, thereby forming four line patterns.

Figure 9C:
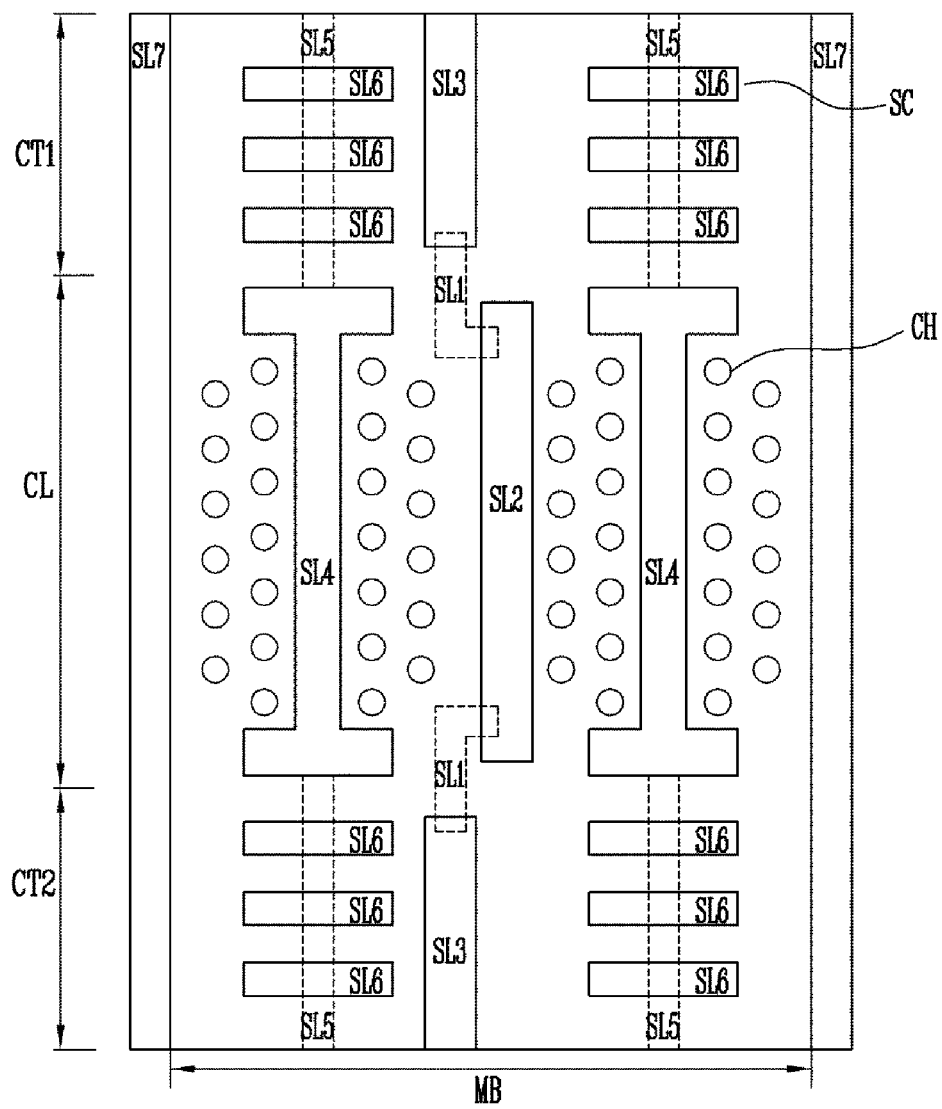

FIG. 9C is a layout view illustrating the structure of a semiconductor device according to an embodiment of the present invention. Hereinafter, a description of the contents of these embodiments the same as those of the previous embodiments is omitted.

As illustrated in FIG. 9C, the semiconductor device according to these embodiments of the present invention may include the sixth slits SL6 having various lengths (not shown). In addition, the third slits SL3 and second slits SL2 may be arranged in a line or a staggered configuration. When the third slit SL3 and the second slit SL2 are staggered with each other according to this embodiment, the first slit SL1 may be bent such that the second slit SL2 and the third slit SL3 are connected with each other. For reference, the second slit SL2 and the third slit SL3 may be connected with each other by increasing the width of the first slit SL1

Figure 10:
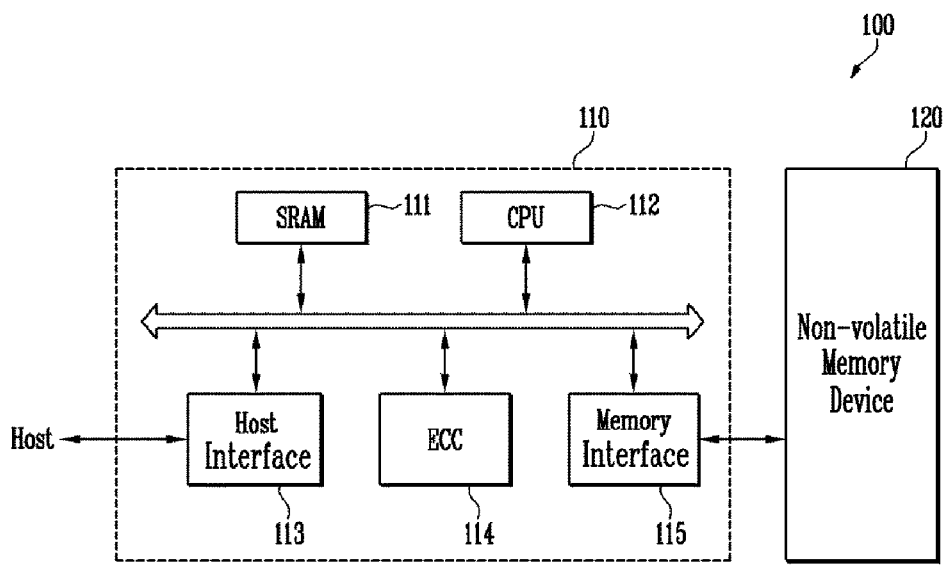
FIG. 10 is a block diagram illustrating the configuration of a memory system according to an embodiment of the present invention.

FIG. 10 is a view illustrating the configuration of a memory system according to an embodiment of the present invention.

As illustrated in FIG. 10, a memory system 100 according to an embodiment of the present invention may include a non-volatile memory device 120 and a memory controller 110.

The non-volatile memory device 120 may have a structure according to the layout as described above. In addition, the non-volatile memory device 120 may be a multi-chip package composed of a plurality of flash memory chips.

The memory controller 110 may be configured to control the non-volatile memory device 120. The memory controller 110 may include SRAM 111, a CPU 112, a host interface 113, an ECC 114 and a memory interface 115. The SRAM 111 may function as an operation memory of the CPU 112. The CPU 112 may perform the general control operation for data exchange of the memory controller 110. The host interface 113 may include a data exchange protocol of a host being coupled to the memory system 100. In addition, the ECC 114 may detect and correct errors included in a data read from the non-volatile memory device 120. The memory interface 115 may interface with the non-volatile memory device 120. The memory controller 110 may further include ROM that stores code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with the outside (e.g., a host) through one of the interface protocols including USB, MMC, PCI-E, SATA, PATA, SCSI, ESDI and IDE.

Figure 11:
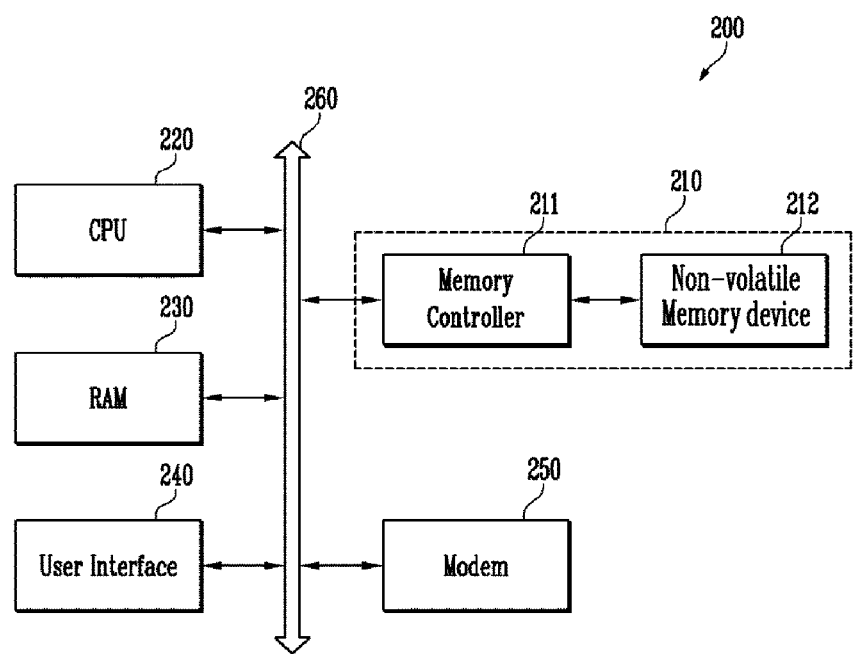
FIG. 11 is a block diagram illustrating the configuration of a computing system according to an embodiment of the present invention

FIG. 11 is a block diagram illustrating the configuration of a computing system according to an embodiment of the present invention.

As illustrated in FIG. 11, a computing system 200 according to an embodiment of the present invention may include a CPU 220, RAM 230, a user interface 240, a modem 250 and a memory system 210 that are electrically coupled to a system bus 260. In addition, when the computing system 200 is a mobile device, a battery may be further included to apply operating voltage to the computing system 200. The computing system 200 may further include application chipsets, a Camera Image Processor (CIS) and mobile DRAM.

As described above with reference to FIG. 10, the memory system 210 may include a non-volatile memory 212 and a memory controller 211. As such, the non-volatile memory device 212 may have a structure according to the layout as described above.

According to an embodiment of the present invention, first and second conductive layers stacked on top of one another may be patterned by using a self-aligned process.

What is claimed is:

1. A method of manufacturing a semiconductor device, the method comprising:
   alternately forming at least one first material layer and second material layers over a substrate;
   forming a first slit through the first and second material layers;
   forming a first insulating layer in the first slit;
   alternately forming third material layers and fourth material layers over a resultant structure including the first insulating layer;
   forming a second slit and a third slit passing through the first to fourth material layers, wherein the first slit is disposed between the second slit and the third slit;
   forming recessed regions by removing the first and third material layers exposed through the second and third slits; and
   forming conductive layers in the recessed regions, the conductive layers including upper conductive layers above the first slit, wherein the upper conductive layers completely cover a central portion of the first slit and the first insulating layer.

2. The method of claim 1, wherein the second slit is located in a cell region, and the third slit is located in a contact region.

3. The method of claim 1, wherein each of the first and second material layers is divided into a plurality of patterns by the first to third slits.

4. The method of claim 1, wherein each of the third and fourth material layers has a shape of a plate including openings formed by the second and third slits.

5. The method of claim 1, further comprising:
   forming a first source layer on the substrate before the alternately forming of the first and second material layers;
   forming a trench by etching the first source layer;
   forming a sacrificial layer in the trench;
   forming channel holes through the first material layers and the second material layers, wherein the channel holes are connected with the trench;
   removing the sacrificial layer exposed on bottom surfaces of the channel holes;
   forming a semiconductor layer in the trench and the channel holes;
   forming a fourth slit through the trench between the channel holes;
   forming a second source layer by doping the semiconductor layer formed in the trench with impurities through the fourth slit; and
   forming a third source layer in the second source layer and a lower portion of the fourth slit, wherein the third source layer is coupled to the first source layer.

6. The method of claim 1, further comprising:
   forming a buffer layer on the substrate before the alternately forming of the first and second material layers;
   forming a trench by etching the buffer layer;
   forming a sacrificial layer in the trench;
   forming channel holes through the first material layers and the second material layers, wherein the channel holes are connected with the trench;
   removing the sacrificial layer exposed on bottom surfaces of the channel holes;
   forming a semiconductor layer in the trench and the channel holes;
   forming a fourth slit between the channel holes, wherein the fourth slit is connected with the trench;
   forming a first source layer by doping the semiconductor layer formed in the trench with impurities through the fourth slit; and
   forming a second source layer in the first source layer.

7. The method of claim 6, further comprising:
   forming an etch stop conductive layer on the substrate before the forming of the buffer layer.

8. The method of claim 1, further comprising:
   forming channel holes through the first to fourth material layers; and
   forming a semiconductor layer in each of the channel holes,
   wherein the first to third slits are spaced from the channel holes.

* * * * *